(12) United States Patent
Mochizuki et al.

(10) Patent No.: US 7,897,930 B2
(45) Date of Patent: Mar. 1, 2011

(54) RADIATION IMAGING APPARATUS AND RADIATION IMAGING SYSTEM

(75) Inventors: Chiori Mochizuki, Sagamihara (JP); Minoru Watanabe, Honjo (JP); Takamasa Ishii, Honjo (JP); Masakazu Morishita, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 142 days.

(21) Appl. No.: 12/299,046

(22) PCT Filed: Jun. 4, 2007

(86) PCT No.: PCT/JP2007/061676
§ 371 (c)(1),
(2), (4) Date: Oct. 30, 2008

(87) PCT Pub. No.: WO2007/142342
PCT Pub. Date: Dec. 13, 2007

(65) Prior Publication Data
US 2009/0230443 A1    Sep. 17, 2009

(30) Foreign Application Priority Data
Jun. 9, 2006   (JP) .................................. 2006-161643

(51) Int. Cl.
G01T 1/24 (2006.01)
(52) U.S. Cl. ................................ 250/370.09; 250/370.11
(58) Field of Classification Search ............. 250/370.09, 250/370.11
See application file for complete search history.

(56) References Cited

U.S. PATENT DOCUMENTS

| | | | |
|---|---|---|---|
| 5,061,979 A | 10/1991 | Kobayashi et al. | 136/244 |
| 5,581,087 A * | 12/1996 | Uddin et al. | 250/370.11 |
| 6,373,062 B1 * | 4/2002 | Ghelmansarai | 250/370.09 |
| 7,038,215 B2 * | 5/2006 | Endo | 250/370.11 |
| 7,205,547 B2 | 4/2007 | Ishii et al. | 250/370.9 |
| 7,205,568 B2 | 4/2007 | Watanabe et al. | 257/59 |
| 7,381,965 B2 | 6/2008 | Ishii et al. | 250/370.11 |
| 7,435,968 B2 | 10/2008 | Watanabe et al. | 250/370.14 |
| 7,465,933 B2 | 12/2008 | Ishii et al. | 250/370.11 |
| 7,470,908 B2 | 12/2008 | Ishii et al. | 250/370.8 |
| 2003/0226974 A1 | 12/2003 | Nomura et al. | 250/370.11 |
| 2006/0062352 A1 | 3/2006 | Nomura et al. | 378/98.8 |
| 2006/0065944 A1 | 3/2006 | Mochizuki et al. | 257/444 |
| 2006/0249763 A1 | 11/2006 | Mochizuki et al. | 257/291 |
| 2007/0146520 A1 | 6/2007 | Watanabe et al. | 348/305 |
| 2009/0004768 A1 | 1/2009 | Watanabe et al. | 438/64 |
| 2009/0032680 A1 | 2/2009 | Watanabe et al. | 250/208.1 |
| 2009/0040348 A1 | 2/2009 | Ishii et al. | 348/294 |

(Continued)

FOREIGN PATENT DOCUMENTS

EP    0660421    6/1995

(Continued)

*Primary Examiner* — Constantine Hannaher
(74) *Attorney, Agent, or Firm* — Fitzpatrick, Cella, Harper & Scinto

(57) ABSTRACT

A radiation imaging apparatus comprises a pixel region, on an insulating substrate 100, including a plurality of pixels arranged in a matrix, each pixel having a conversion element 101 that converts radiation into electric charges and a switching element 102 connected to the conversion element 101. The conversion element 101 has an upper electrode layer 119, a lower electrode layer 115, a semiconductor layer 117 arranged between the upper electrode layer 119 and the lower electrode layer 115. The upper electrode layer 119 or the lower electrode layer 115 has an opening 200 at least within a region where the semiconductor layer 117 is arranged.

12 Claims, 27 Drawing Sheets

U.S. PATENT DOCUMENTS

2009/0052624 A1  2/2009  Mochizuki et al. .......... 378/98.8

FOREIGN PATENT DOCUMENTS

| EP | 296603 | 12/1998 |
| JP | 07-502865 | 3/1995 |
| JP | 08-116044 | 5/1996 |
| JP | 10-084106 | 3/1998 |
| JP | 11-125840 | 5/1999 |
| JP | 2004-015002 | 1/2004 |
| WO | WO 93/14418 | 7/1993 |

* cited by examiner

F I G. 14
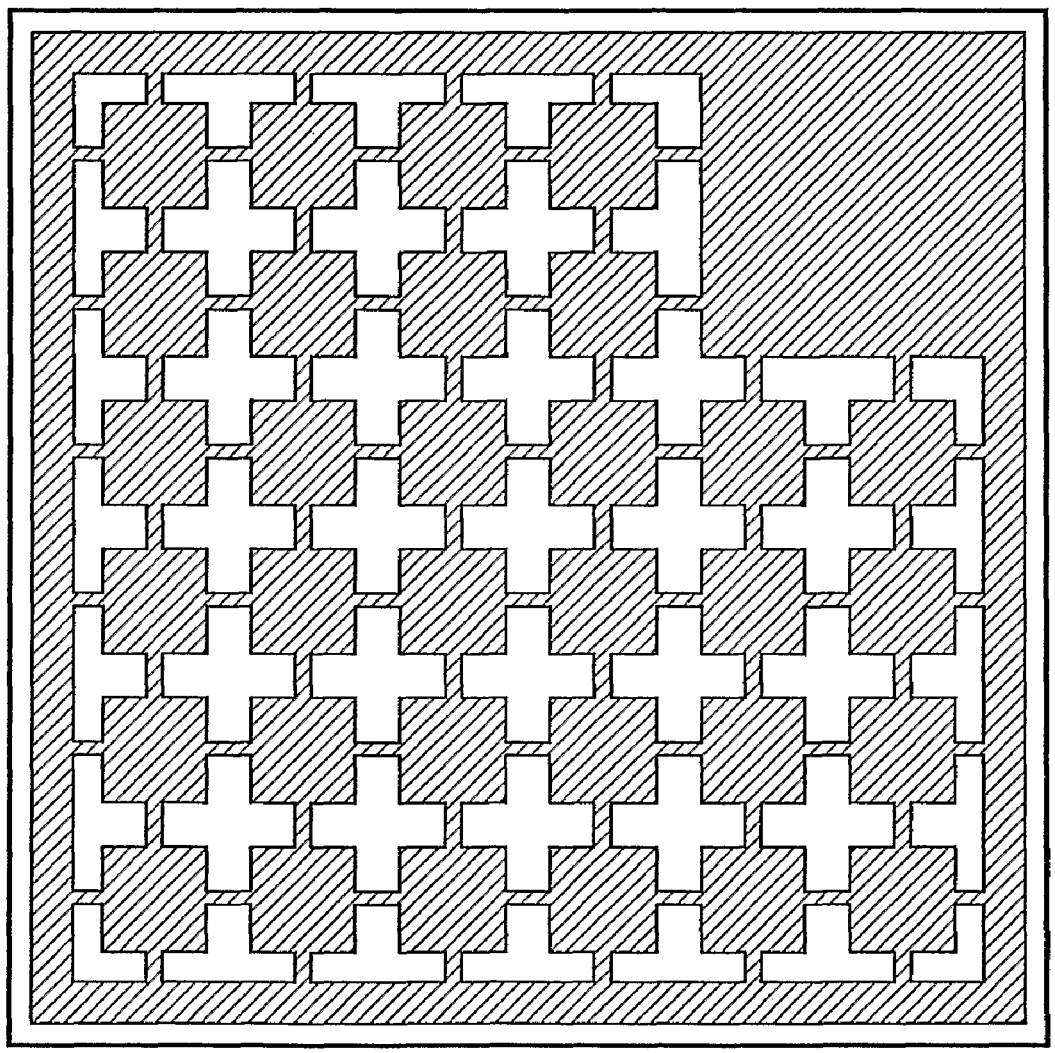

F I G. 15
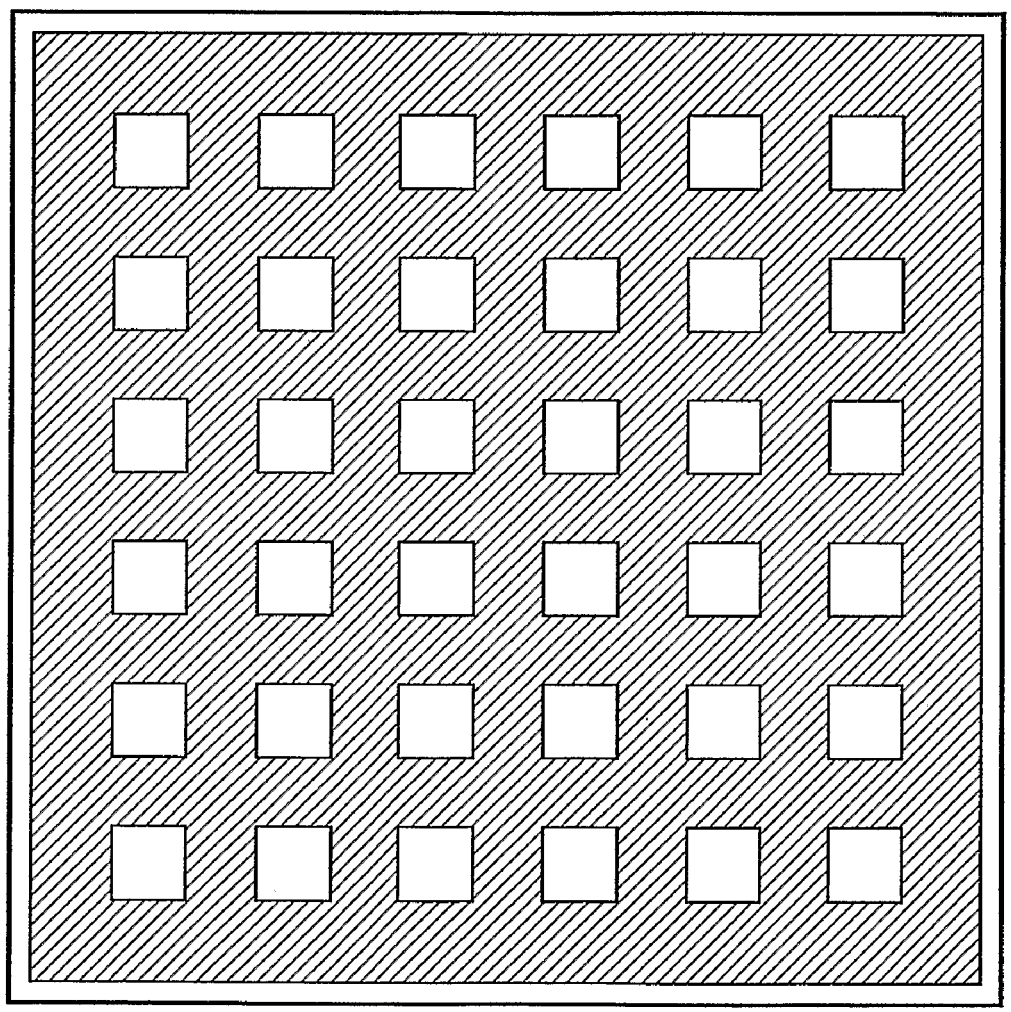

RADIATION IMAGING APPARATUS AND RADIATION IMAGING SYSTEM

TECHNICAL FIELD

The present invention relates to a radiation imaging apparatus and a radiation imaging system which can be applied to a medical imaging diagnosis apparatus, a nondestructive inspection apparatus and an analyzing apparatus using radiation.

BACKGROUND ART

Radiation imaging apparatuses are used in a variety of fields ranging from general imaging such as X-ray imaging for acquiring a still image to fluorography for acquiring a moving image. A radiation imaging apparatus uses a sensor panel formed by two-dimensionally arranging, on a substrate, a plurality of pixels, each having a switching element and a conversion element that converts radiation or light from a wavelength converter into electric charges. In particular, a flat panel detector (to be referred to as an "FPD" hereinafter) has received a great deal of attention. In the FPD, a plurality of pixels, each having a conversion element made of an amorphous semiconductor such as amorphous silicon (to be referred to as "a-Si" hereinafter) and a thin-film transistor (to be referred to as a "TFT" hereinafter) made of an amorphous semiconductor are two-dimensionally arranged on an insulating substrate.

JPA07-502865 discloses a PIN-type FPD having a plurality of two-dimensionally arranged pixels, each including a PIN photodiode and a TFT. The PIN-type FPD has a stacked structure in which the layer of PIN photodiode is stacked on the layer of TFT on a substrate.

Japanese Patent Laid-Open No. 08-116044 discloses an MIS-type FPD using a sensor panel formed by two-dimensionally arranging a plurality of pixels, each including a TFT and an MIS photosensor made of a-Si. The MIS-type FPD has a planar structure in which the MIS photosensor is made of the same layer as that of TFT on a substrate.

Japanese Patent Laid-Open No. 2004-015002 discloses an MIS-type FPD having a stacked structure in which the layer of MIS photosensor is stacked on the layer of TFT on a substrate.

However, the conventional radiation imaging apparatus can hardly improve the sensitivity of the conversion element. To improve the sensitivity of the conversion element, it is important to increase the output of the conversion element or to reduce noise. Generally, the output can be increased by increasing the opening ratio of the conversion element. When the opening ratio of the conversion element becomes high, its capacitance increases, resulting in an increase in noise. On the other hand, noise reduction can be achieved by decreasing the capacitance of the conversion element. To decrease the capacitance of the conversion element, its opening ratio must be low. If the opening ratio of the conversion element is low, the output decreases.

That is, since the improvement of the output of the conversion element and noise reduction have a trade-off relationship, the sensitivity of the conversion element cannot be expected to be higher.

DISCLOSURE OF INVENTION

The present invention has been made in consideration of the above-described problems, and has as its object to improve a sensitivity of a conversion element.

According to the first aspect of the present invention, there is provided a radiation imaging apparatus which comprises a pixel region, on a substrate, including a plurality of pixels arranged in a matrix, each pixel having a conversion element that converts radiation into electric charges and a switching element connected to the conversion element, wherein the conversion element has a first electrode layer, a second electrode layer, a semiconductor layer arranged between the first electrode layer and the second electrode layer, and the first electrode layer or the second electrode layer has an opening at least within a region where the semiconductor layer is arranged.

According to the second aspect of the present invention, there is provided a radiation imaging system which comprises the above-described radiation imaging apparatus, and a signal-processing unit configured to process a signal from the radiation imaging apparatus.

Further features of the present invention will become apparent from the following description of exemplary embodiments with reference to the attached drawings.

BRIEF DESCRIPTION OF DRAWINGS

FIG. 14 is a schematic plan view of a lower electrode of the conversion element;

FIG. 15 is a schematic plan view of an upper electrode of the conversion element;

BEST MODE FOR CARRYING OUT THE INVENTION

Figure 1:
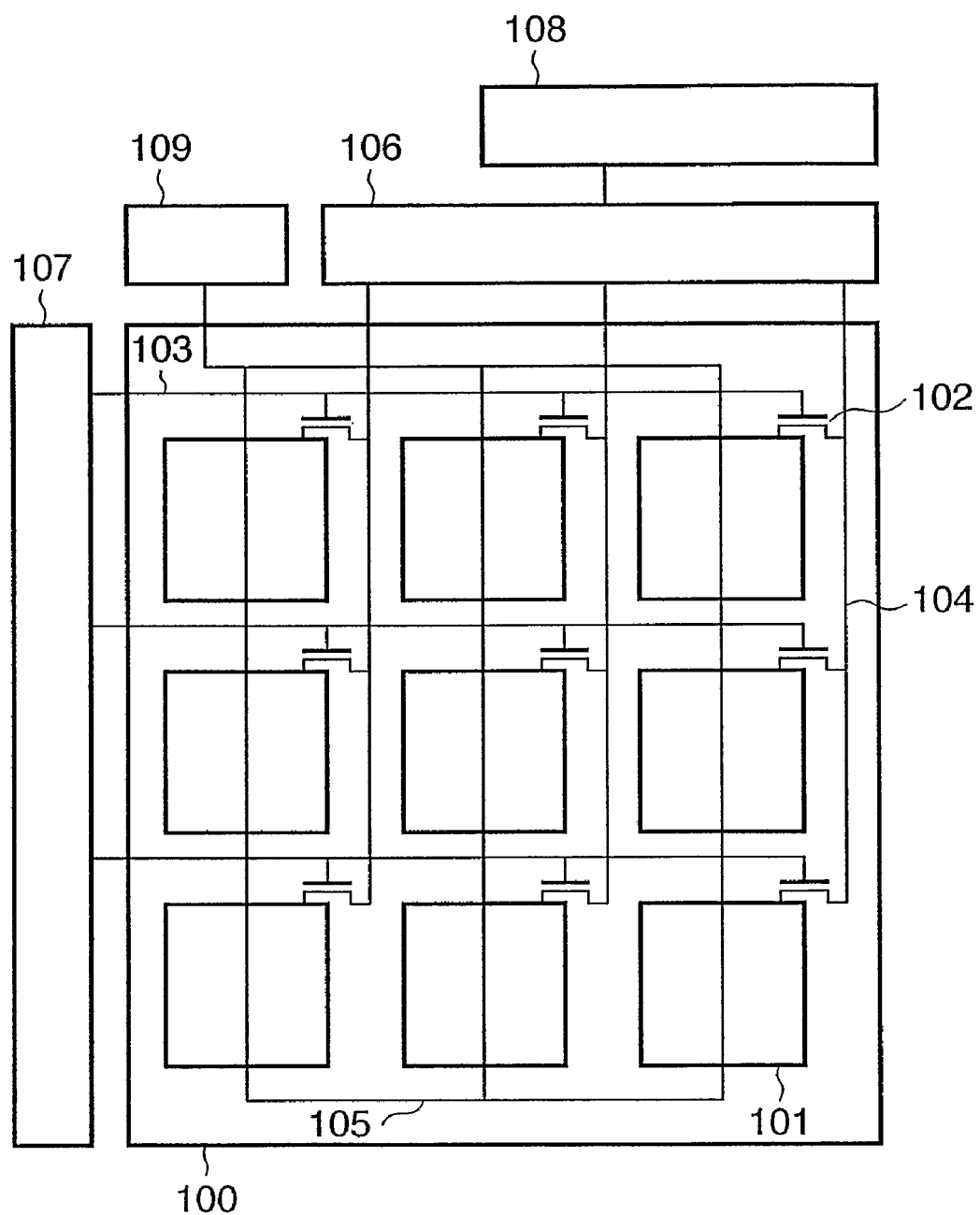
FIG. 1 is an exemplary plan view of a radiation imaging apparatus according to the preferred embodiment of the present invention.

FIG. 1 is a plan view showing an arrangement example of a radiation imaging apparatus. Reference numeral 101 denotes conversion elements to convert radiation into electric charges; 102, switching elements; 103, driving lines; 104, signal lines; 105, a bias lines; 106, a signal processing circuitry; 107, a driving circuitry; 108, an A/D conversion unit; and 109, a bias power supply unit. Each pixel includes the conversion element 101 and switching element 102. A plurality of pixels are two-dimensionally arranged to form a pixel region.

An insulating substrate 100 is preferably a glass substrate, a quartz substrate, a plastic substrate, or the like. An example of the conversion element 101 is preferably a photoelectric conversion element. The photoelectric conversion element is combined with a wavelength converter that converts radiation into light in a wavelength band that can be sensed by the photoelectric conversion element, that is, to which the photoelectric conversion element is sensitive. As the photoelectric conversion element, for example, an MIS photoelectric conversion element or a PIN photoelectric conversion element may be used. The MIS photoelectric conversion element and PIN photoelectric conversion element are preferably formed by using, for example, a-Si. Alternatively, a direct conversion element capable of directly converting radiation into electric charges may be used as the conversion element 101. Examples of the material used for the direct conversion element are amorphous selenium, gallium arsenide, gallium phosphide, lead iodide, mercury iodide, CdTe, and CdZnTe. The first to sixth embodiments exemplify an MIS photoelectric conversion element. The seventh to 11th embodiments exemplify a PIN photoelectric conversion element. However, the present invention is not limited to these examples.

As the switching element 102, for example, a thin-film transistor (TFT) may be used. The thin-film transistor (TFT) is preferably formed by using a-Si.

The driving line 103 is connected to the gate electrodes of the plurality of switching elements 102 arrayed in the row direction to apply a driving signal from the driving circuitry 107 to the switching elements 102. The signal line 104 is connected to the source electrodes or drain electrodes of the plurality of switching elements 102 arrayed in the column direction to transmit, to the signal processing circuitry 106, signal charges generated in the conversion elements 101 and transferred by the switching elements 102. The signal processing circuitry 106 converts the signal charges transferred from the plurality of pixels in parallel into a serial signal, and the A/D conversion unit 108 converts the analog signal to a digital signal and outputs it. The bias power supply unit 109 is designed to supply a bias to make the conversion elements 101 execute photoelectric conversion and a bias to initialize them. The bias power supply unit 109 is connected to one electrode of each conversion element 101 via the bias line 105.

The radiation imaging apparatus can generate various kinds of noise, including shot noise, kTC noise, signal line noise, IC noise, and gate line noise. The shot noise is proportional to the square root of the sensor opening ratio. The kTC noise is proportional to the square root of the capacitance of the conversion element. The signal line noise is proportional to the square root of the line resistance and the line parasitic capacitance. The IC noise is proportional to the parasitic capacitance of the signal line. The gate line noise is proportional to the square root of the line resistance. Of them, the kTC noise and signal line noise are dominant. To reduce these kinds of noise, it is effective to decrease the capacitance of the conversion element.

The present inventors have noted that the capacitance of the conversion element is generally formed in the overlap portion of the upper and lower electrodes and found a structure to make the overlap portion of the upper and lower electrodes of the conversion element smaller while ensuring its output in consideration of the spread of an electric field in a portion except overlap of the upper and lower electrodes. This structure allows for a decrease in the capacitance of the conversion element without reducing its opening ratio.

A radiation imaging apparatus according to a preferred embodiment of the present invention will be described below in detail with reference to the accompanying drawings. In this specification, radiation includes electromagnetic waves such as visible light, X-rays, and γ-rays, as well as particulate beams of α-particles and β-particles.

First Embodiment

Figure 2:
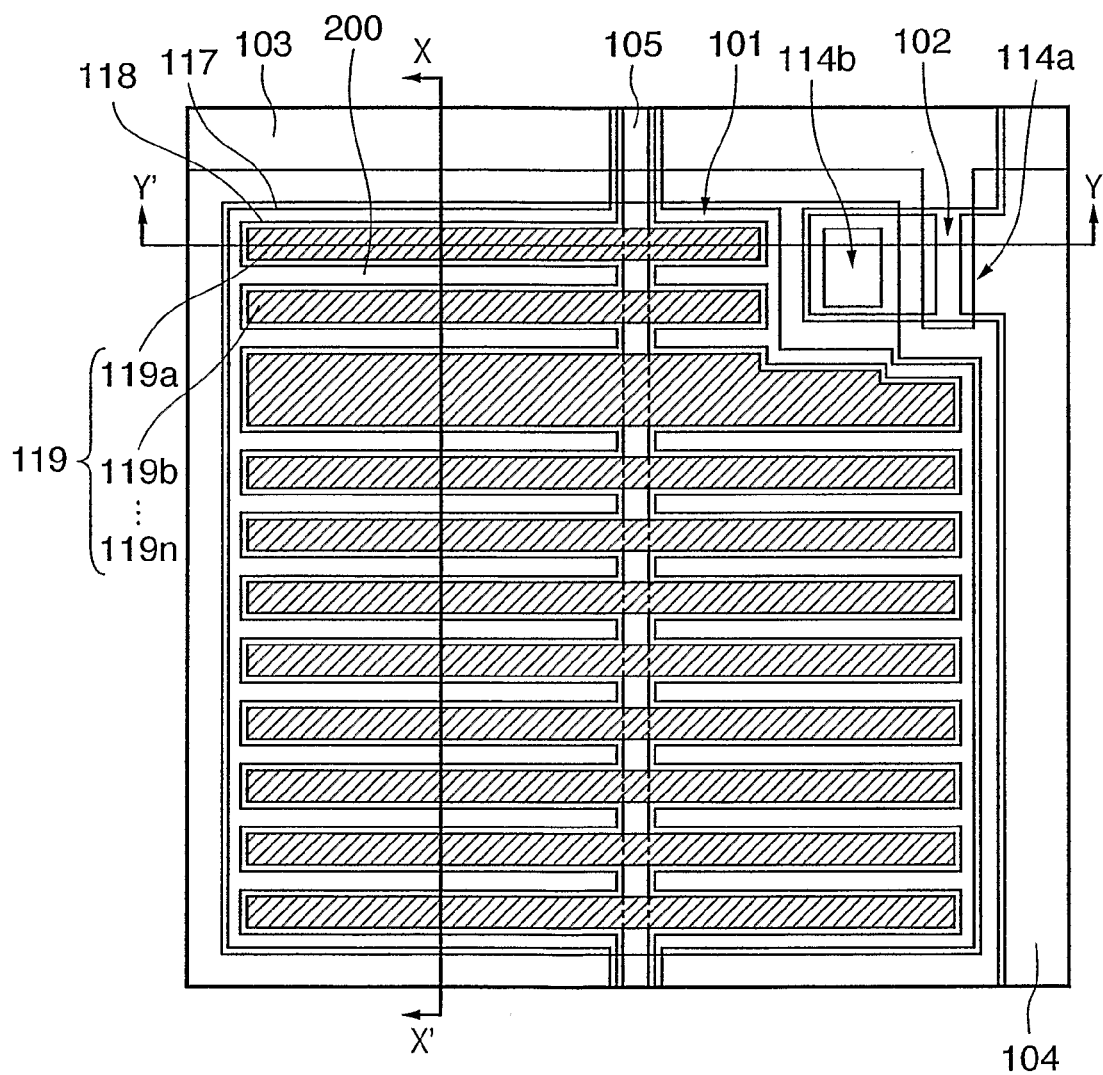
FIG. 2 is a schematic plan view of a pixel according to the preferred first embodiment of the present invention.

FIG. 2 is a schematic plan view for explaining a structural example of one pixel arranged in a radiation imaging apparatus according to the preferred first embodiment of the present invention. As shown in FIG. 2, one pixel includes a conversion element 101 and a switching element 102. A driving line 103 is connected to the gate electrode of the switching element 102. A signal line 104 is connected to a source electrode 114a of the switching element 102. An upper electrode layer 119 of the conversion element 101 has a divided structure with a plurality of band-shaped electrodes 119a, 119b, . . . , 119n which are connected to a bias line 105. Hence, the upper electrode layer 119 has openings 200 in which an impurity semiconductor layer 118, formed under the electrodes 119a, 119b, . . . , 119n to serve as an ohmic contact layer, is not present.

Figure 3:
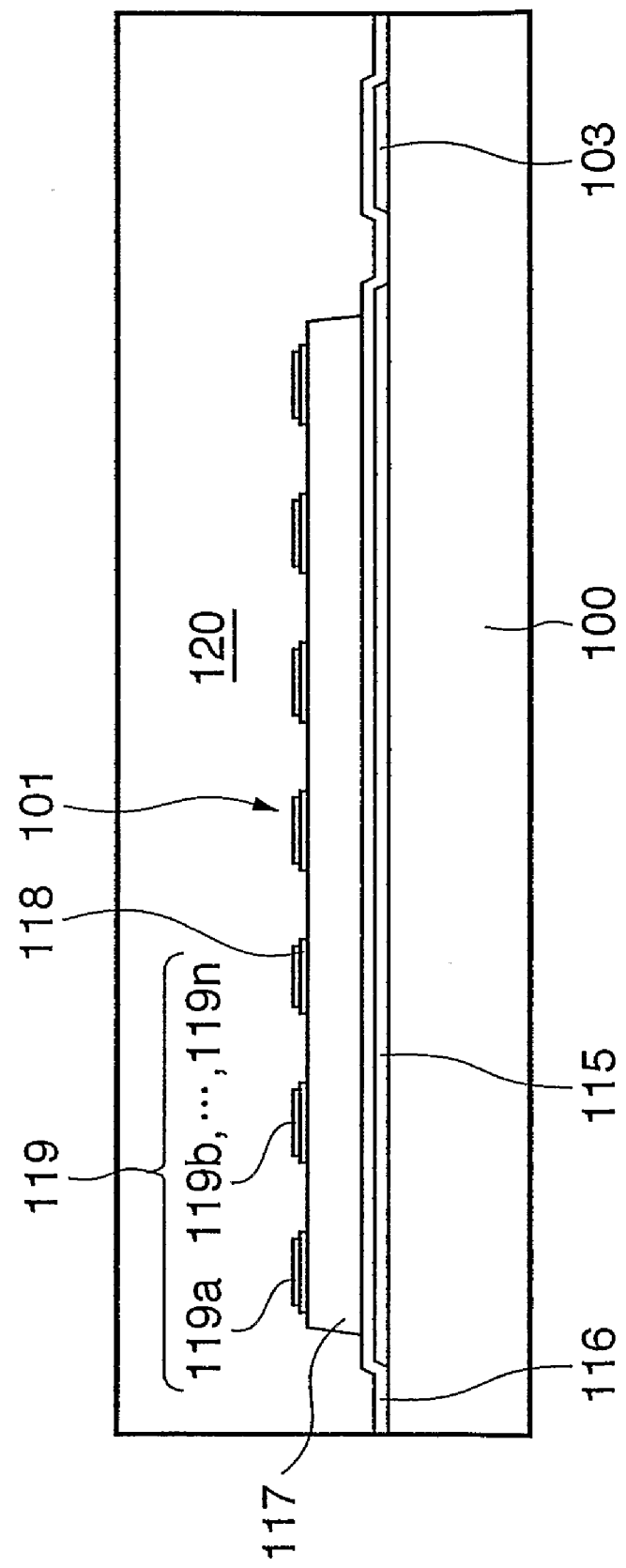
FIG. 3 is a schematic cross-sectional view along line X-X' of FIG. 2.
Figure 4:
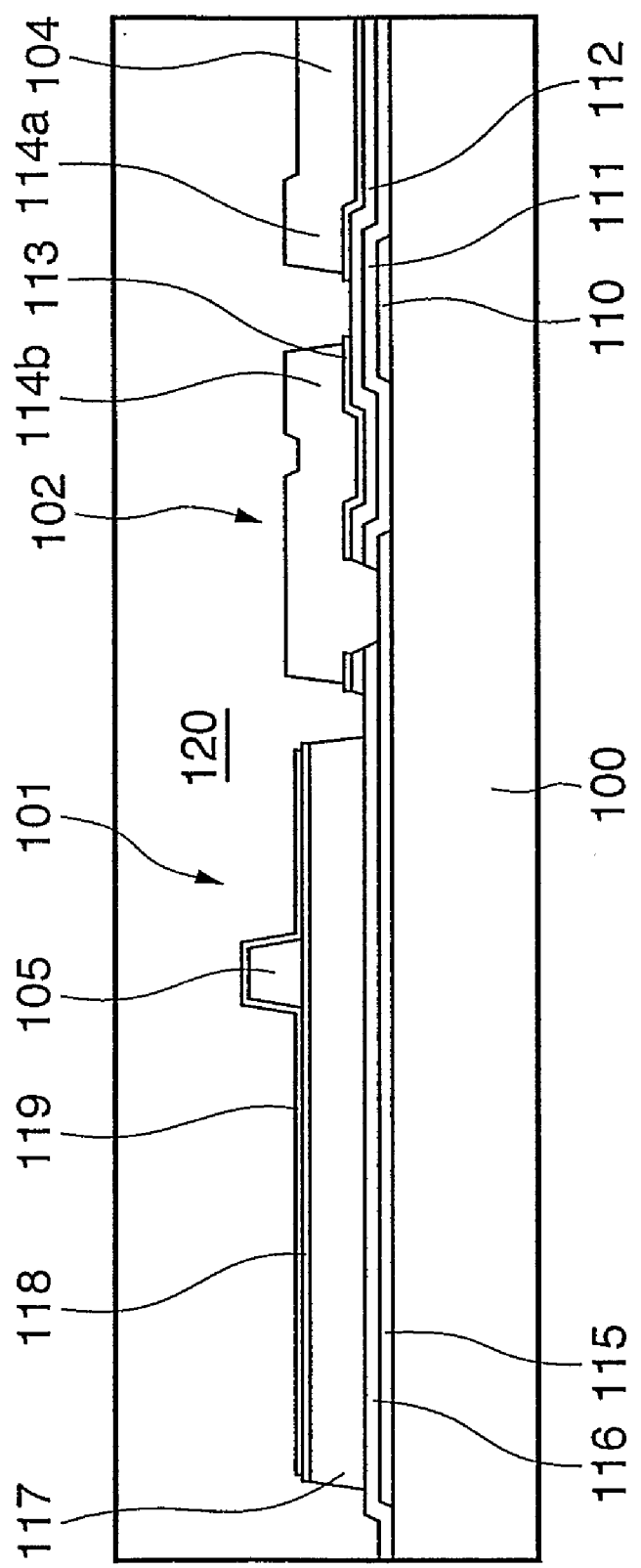
FIG. 4 is a schematic cross-sectional view along line Y-Y' of FIG. 2.

FIG. 3 is a schematic cross-sectional view along line X-X' of FIG. 2. FIG. 4 is a schematic cross-sectional view along line Y-Y' of FIG. 2. The structure of the pixel according to this embodiment and a method of forming the pixel will be described below with reference to FIGS. 3 and 4.

First, a gate electrode 110 of the switching element 102 and a lower electrode layer 115 of the conversion element 101 are formed on an insulating substrate 100. A first insulating layer 111 serving as the gate insulating film of the switching element 102 and a second insulating layer 116 serving as the insulating layer of the conversion element 101 are formed. A first semiconductor layer 112 serving as the active layer of the switching element 102 and a second semiconductor layer 117 serving as the conversion layer of the conversion element 101 are formed. In FIG. 3, the first semiconductor layer 112 is thinner than the second semiconductor layer 117. However, the first semiconductor layer 112 may remain almost as thick as the second semiconductor layer 117. Then, a first impurity semiconductor layer 113 serving as the ohmic contact layer of the switching element 102 and the second impurity semiconductor layer 118 of the conversion element 101 are formed. The bias line 105 and the source electrode 114a and a drain electrode 114b of the switching element 102 are formed. A channel portion is formed by etching the first impurity semiconductor layer 113. The upper electrode layer (transparent electrode layer) 119 of the conversion element 101, a protective layer 120, and a wavelength converter (not shown) are sequentially formed. The conversion element 101 includes the layers 115 to 119. The switching element 102 includes the layers 110 to 114a and 114b.

In this embodiment, the upper electrode layer 119 has the openings 200 in a region where at least the second semiconductor layer 117 is arranged and includes the plurality of divided electrodes 119a, 119b, . . . , 119n which are distributed in the region. The electrodes 119a, 119b, . . . , 119n are electrically connected to the bias line 105. The width of the opening 200 may be within the limit of being able to capture carriers generated in the second semiconductor layer 117 upon photoelectric conversion by using the spread of the electric field from the electrodes 119a, 119b, . . . , 119n. The opening 200 is preferably included in a region of 5 µm from each end of the electrodes 119a, 119b, . . . , 119n, although it depends on the thickness and impurity concentration of the second semiconductor layer 117. That is, the width of the opening 200 is preferably about 10 µm width because of the spread of the electric field. The opening 200 needs to be formed in this range, and its shape is not particularly limited. For example, the opening 200 can have arbitrary shapes such as a polygonal shape, a circular shape, an elliptical shape, or an indeterminate shape. The structure of the opening 200 is also applicable to the second to 11th embodiments to be described later. The overlap area of the upper and lower electrodes of the conversion element 101 generally determines its capacitance. The conversion element of this embodiment has a smaller capacitance than a conventional conversion element so that noise caused by the capacitance of the conversion element can be reduced.

Several factors determine the sensitivity of the conversion element. For example, the amount of light incident on the semiconductor layer of the conversion element determines its sensitivity. The radiation imaging apparatus of this embodiment has the openings 200, that is, regions which are formed by removing the impurity semiconductor layer 118 of the conversion element 101 and eliminate unwanted light absorption that does not contribute to output in the impurity semiconductor layer. For this reason, the light utilization ratio of the conversion element increases so that a high sensitivity can be obtained.

According to this embodiment, since the capacitance of the conversion element can be reduced, the size of the switching element connected to the conversion element can be small, and the opening ratio of the conversion element can increase. Additionally, the overlap area of the upper and lower electrodes of the conversion element decreases. This makes it possible to suppress the increase in capacitance of the conversion element caused by the increase in its opening ratio, preventing a decrease in sensitivity. Furthermore, since the size of the switching element can be small, the overlap capacitance between the gate electrode 110 and the source electrode 114a of the switching element 102 decreases. This reduces the parasitic capacitance of the signal line 104 so that further noise reduction can be achieved.

Second Embodiment

Figure 5:
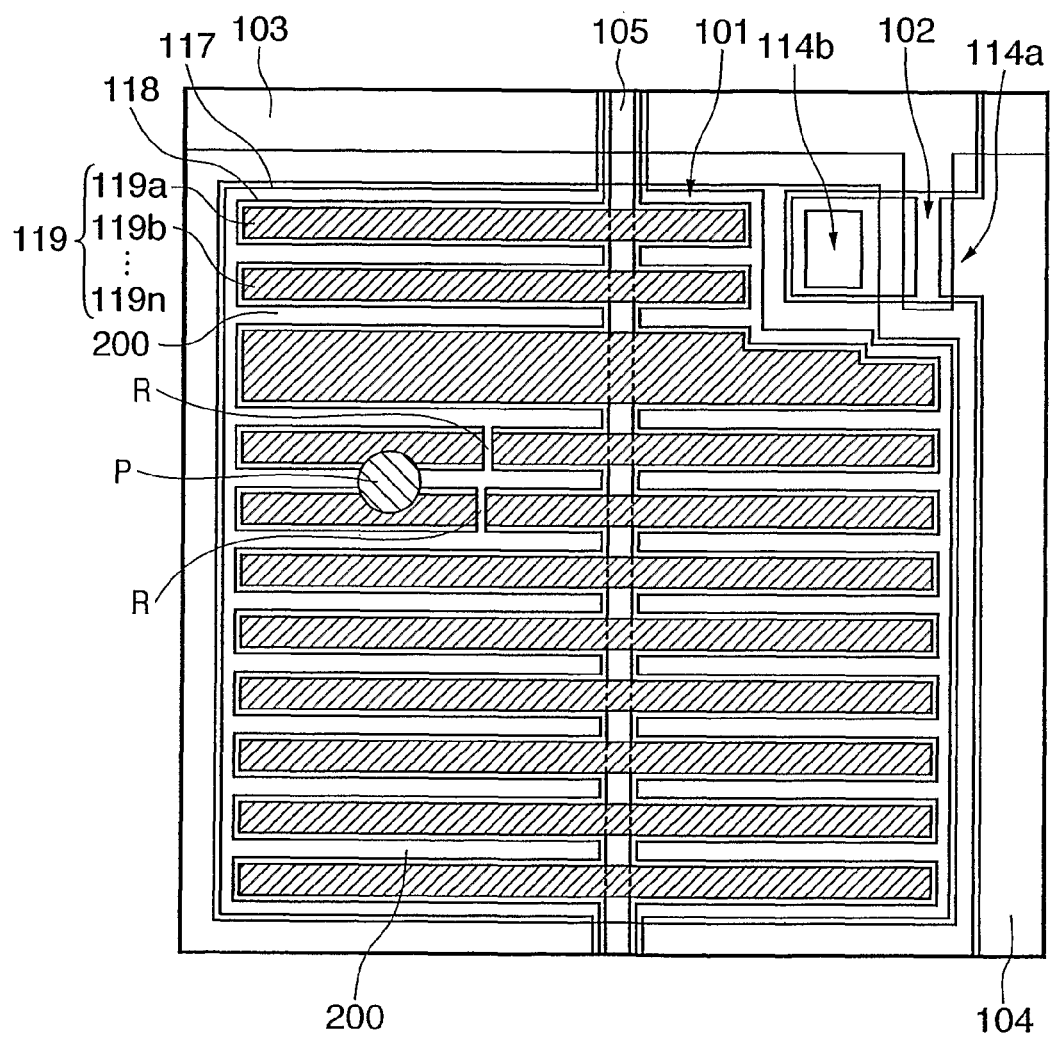
FIG. 5 is a schematic plan view of a conversion element repair according to the preferred second embodiment of the present invention.

FIG. 5 is a schematic plan view for explaining a structural example of one pixel arranged in a radiation imaging apparatus according to the preferred second embodiment of the present invention. The same reference numerals as in the first embodiment denote the similar elements in the second embodiment. P indicates a foreign substance that causes a short circuit. R indicates a region formed by partially removing an upper electrode layer 119 and an impurity semiconductor layer 118 of a conversion element 101. As a characteristic feature of this embodiment, when a short circuit is created between the upper electrode layer 119 and a lower electrode layer 115 of the conversion element, the upper electrode layer 119 corresponding to the portion with the short circuit is cut out. This allows to repair the short circuit between the upper electrode layer 119 and the lower electrode layer 115 and form a defect-free substrate at a low cost. In this case, the output of the conversion element decreases slightly. However, the decrease in output can be compensated by, for example, output correction.

Third Embodiment

Figure 6:
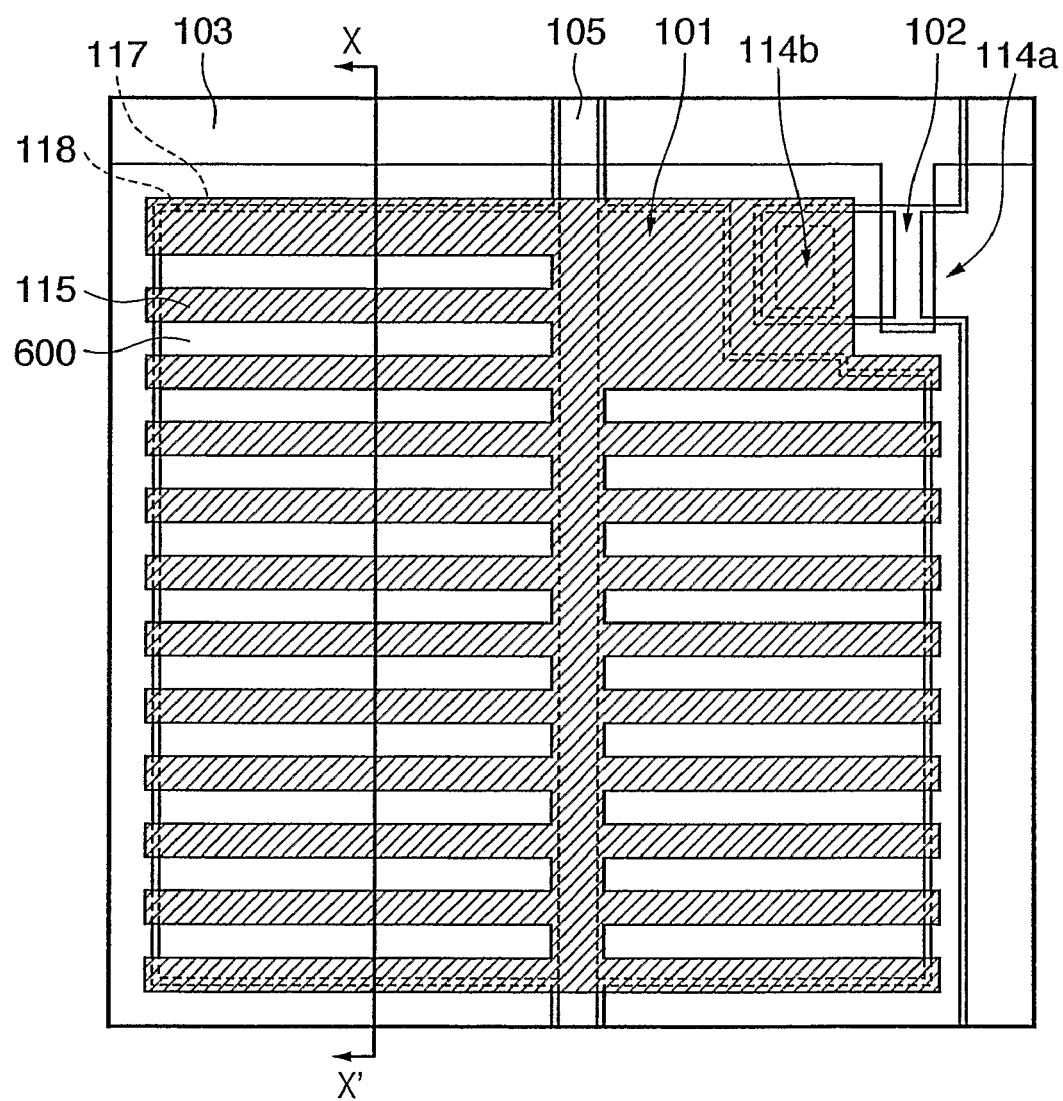
FIG. 6 is a schematic plan view of a pixel according to the preferred third embodiment of the present invention.

FIG. 6 is a schematic plan view of one pixel according to the preferred third embodiment of the present invention. The same reference numerals as in the first embodiment denote the similar elements in the third embodiment.

Figure 7:
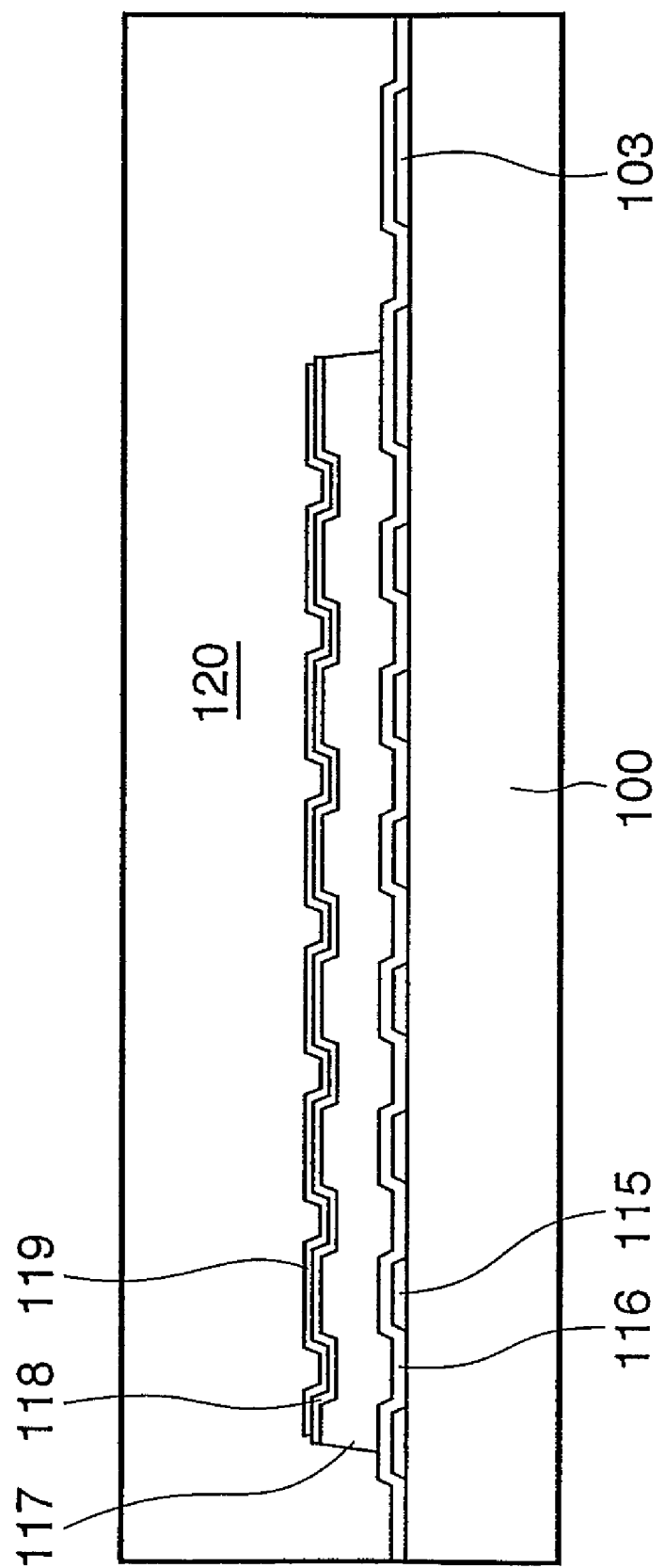
FIG. 7 is a schematic cross-sectional view along line X-X' of FIG. 6.

FIG. 7 is a schematic cross-sectional view along line X-X' of FIG. 6. Reference numeral 115 denotes a lower electrode layer of a conversion element 101; 116, a second insulating layer serving as the insulating layer of the conversion element 101; 117, a second semiconductor layer serving as the photoelectric conversion layer of the conversion element 101; 118, a second impurity semiconductor layer of the conversion element 101; and 119, an upper electrode layer (transparent electrode layer) of the conversion element 101. The conversion element 101 includes the layers 116 to 119. Reference numeral 120 denotes a protective layer. A wavelength converter (not shown) is stacked on the protective layer 120.

In this embodiment, the lower electrode layer 115 of the conversion element 101 has a comb-like electrode structure having slits 600 in a region where at least the second semiconductor layer 117 is arranged. The electrode elements have an interval of about 10 µm and are basically connected to a source electrode 114a or a drain electrode 114b of a switching element 102 via a contact hole. As in the first embodiment, the overlap area of the upper and lower electrodes of the sensor generally determines the capacitance of the conversion element 101. The conversion element of this embodiment has a lower capacitance than a conventional conversion element so that noise caused by the capacitance of the conversion element can be reduced. Additionally, the conversion element has a lower capacitance, reducing the size of the switching element. As a result, the opening ratio of the conversion element can further increase.

In general, a conversion element using amorphous silicon (to be referred to as "a-Si" hereinafter) may induce degradation of sensor characteristic upon long time bias application. To prevent this, a zero-potential bias may be applied to reduce the variation caused by long time use except upon imaging.

On the other hand, application of a predetermined bias only upon imaging may generate an unwanted current by, for example, defects in the a-Si material, resulting in a decrease in sensitivity.

Waiting for several ten seconds after application of a predetermined bias can prevent this phenomenon. The apparatus performs actual operation in consideration of immediacy. That is, light irradiation is executed before the reading operation so that image reading can be done immediately. This driving method enables immediate reading.

Figure 8:
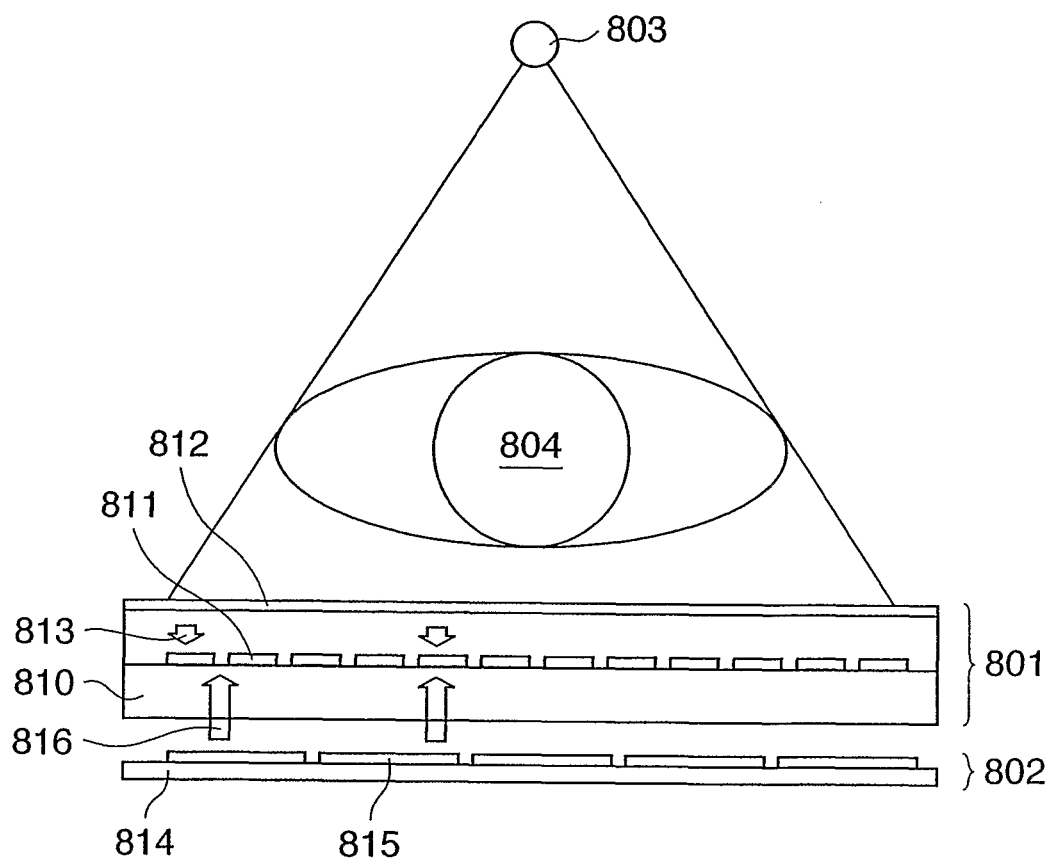
FIG. 8 is a schematic cross-sectional view of the radiation imaging apparatus.

FIG. 8 is a schematic cross-sectional of the radiation imaging apparatus according to this embodiment. Reference numeral 801 denotes a sensor substrate; 802, a light source; 803, a radiation source; and 804, a specimen. The sensor substrate 801 is formed by two-dimensionally arraying a plurality of pixels 811 on an insulating substrate 810. A wavelength converter 812 to convert the wavelength of radiation is arranged on the sensor substrate 801. The wavelength converter 812 converts radiation that has passed through the specimen 804 into visible light 813, and the visible light is incident on the pixels 811. The light source 802 is formed by two-dimensionally arranging a plurality of LEDs 815 on a light source substrate 814 and arranged on the lower surface of the sensor substrate 801. Light 816 emitted from the light source 802 is incident on the pixels 811 from the lower surface of the sensor substrate 801.

As described above, to cause light to travel from the lower surface of the sensor substrate, the lower electrode layer of the conversion element has an opening, as in this embodiment. This structure enables to efficiently input light to the conversion element. This reduces the size of the light source and implements a compact lightweight apparatus. Since the shape of the lower electrode layer of the conversion element is a factor to create a short circuit between its upper and lower electrodes, accurate taper control is necessary.

Fourth Embodiment

Figures 9A, 9B:
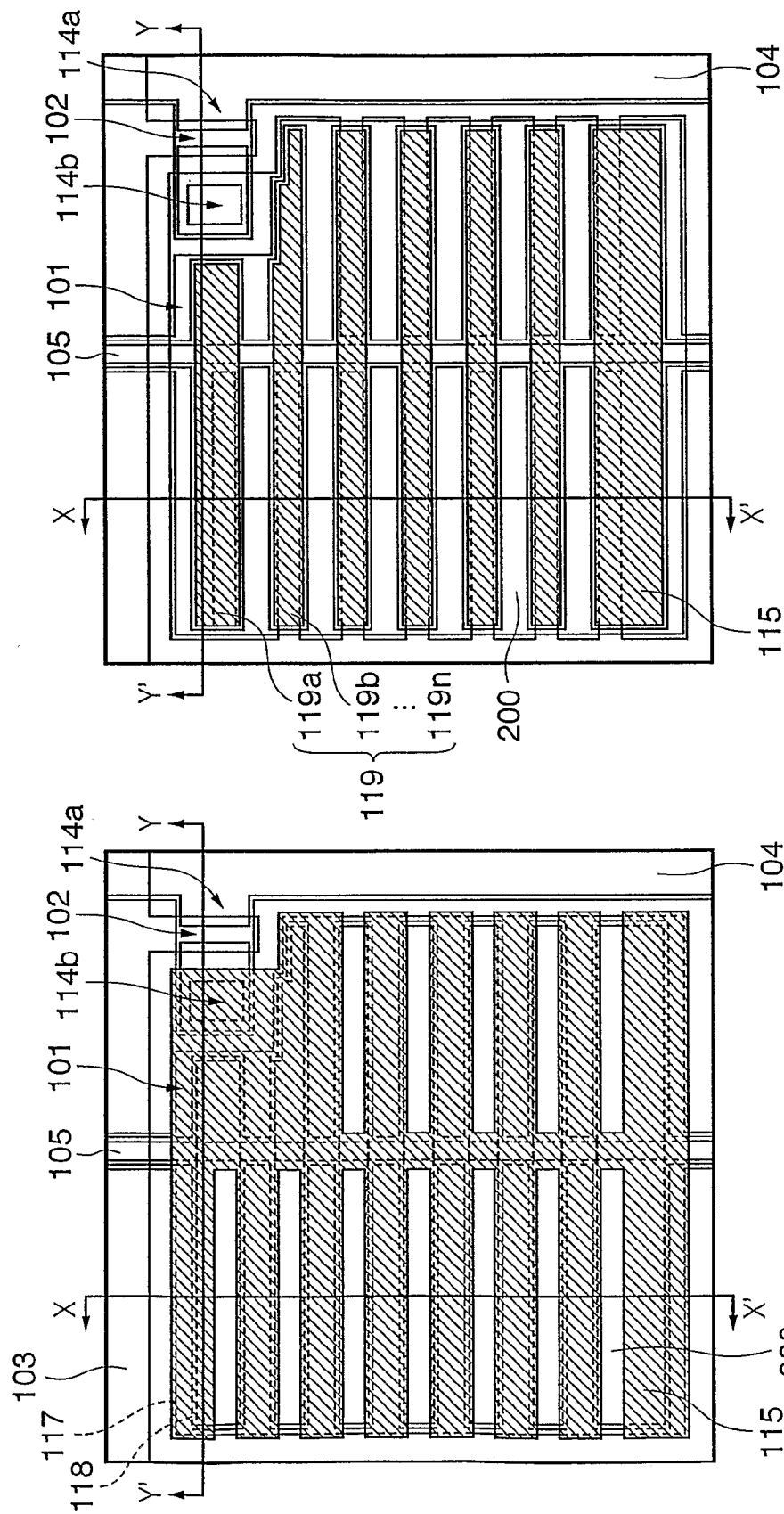
FIG. 9A is a schematic plan view of a pixel according to the preferred forth embodiment of the present invention.
FIG. 9B is a schematic plan view of a pixel according to the preferred forth embodiment of the present invention.

FIGS. 9A and 9B are schematic plan views of one pixel according to the preferred fourth embodiment of the present invention. FIG. 9A shows the lower electrode layer side, and FIG. 9B shows the upper electrode layer side. The same reference numerals as in the first embodiment denote the similar elements in the fourth embodiment.

Figure 10:
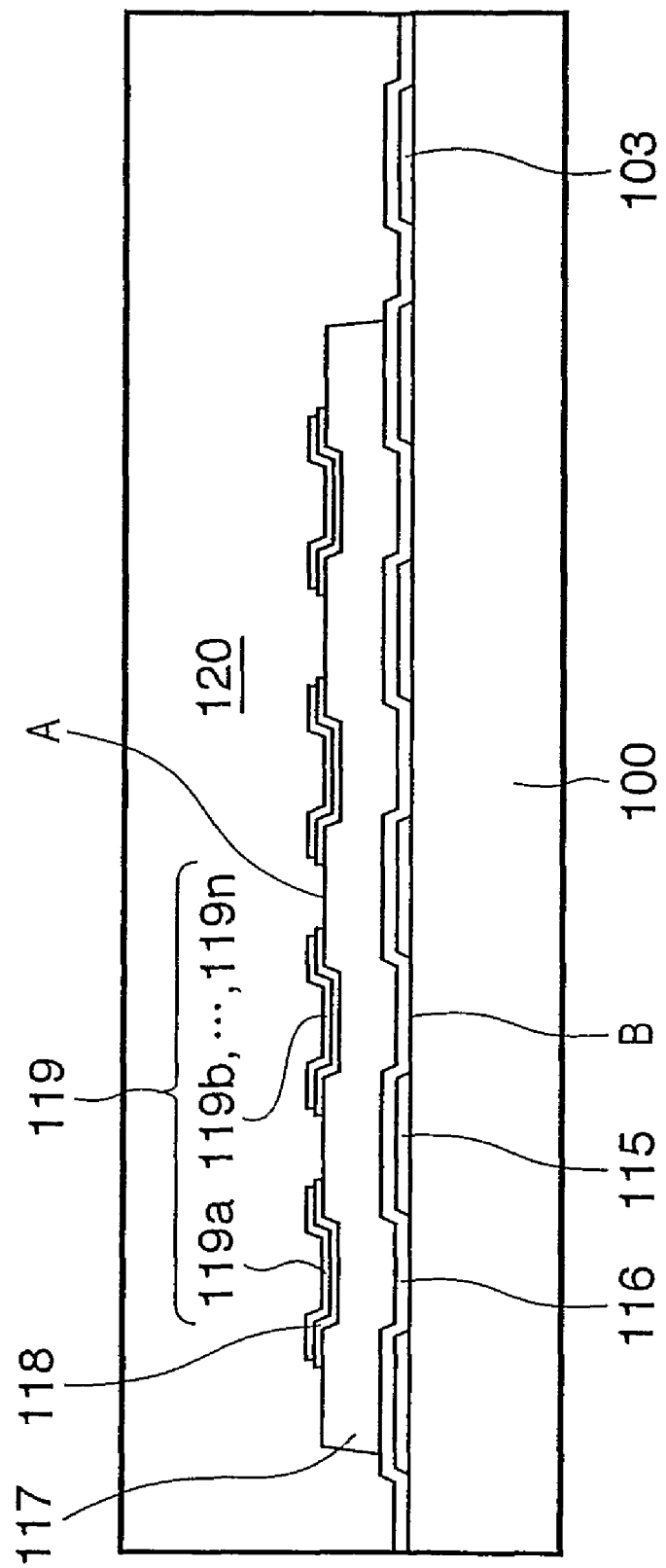
FIG. 10 is a schematic cross-sectional view along line X-X' of FIGS. 9A and 9B.

FIG. 10 is a schematic cross-sectional view along line X-X' of FIGS. 9A and 9B. Reference numeral 115 denotes a lower electrode layer of a conversion element 101; 116, a second insulating layer serving as the insulating layer of the conversion element 101; 117, a second semiconductor layer serving as the photoelectric conversion layer of the conversion element 101; 118, a second impurity semiconductor layer of the conversion element 101; and 119, an upper electrode layer (transparent electrode layer) of the conversion element 101. The conversion element 101 includes the layers 116 to 119. Reference numeral 120 denotes a protective layer. A wavelength converter (not shown) is stacked on the protective layer 120.

The lower electrode layer 115 of the conversion element 101 is arranged under a region A (opening 200) without the upper electrode layer 119 of the conversion element 101. Conversely, the upper electrode layer 119 of the conversion element 101 is arranged above a region B (slit 600) without the lower electrode layer 115 of the conversion element 101. The upper electrode layer 119 and lower electrode layer 115 of the conversion element 101 overlap except opening through both electrodes. If opening exists, the electric field cannot sufficiently spread, and carriers generated by photoelectric conversion cannot smoothly drift. The interval between the individual electrodes of the conversion element 101 (the width of the opening 200 and slit 600) is about 10 µm, as in the above-described embodiments. The schematic cross-sectional view along line Y-Y' of FIGS. 9A and 9B indicates the overlap portion of the upper and lower electrodes of the above-described conversion element, like FIG. 3 of the first embodiment.

Fifth Embodiment

Figure 11:
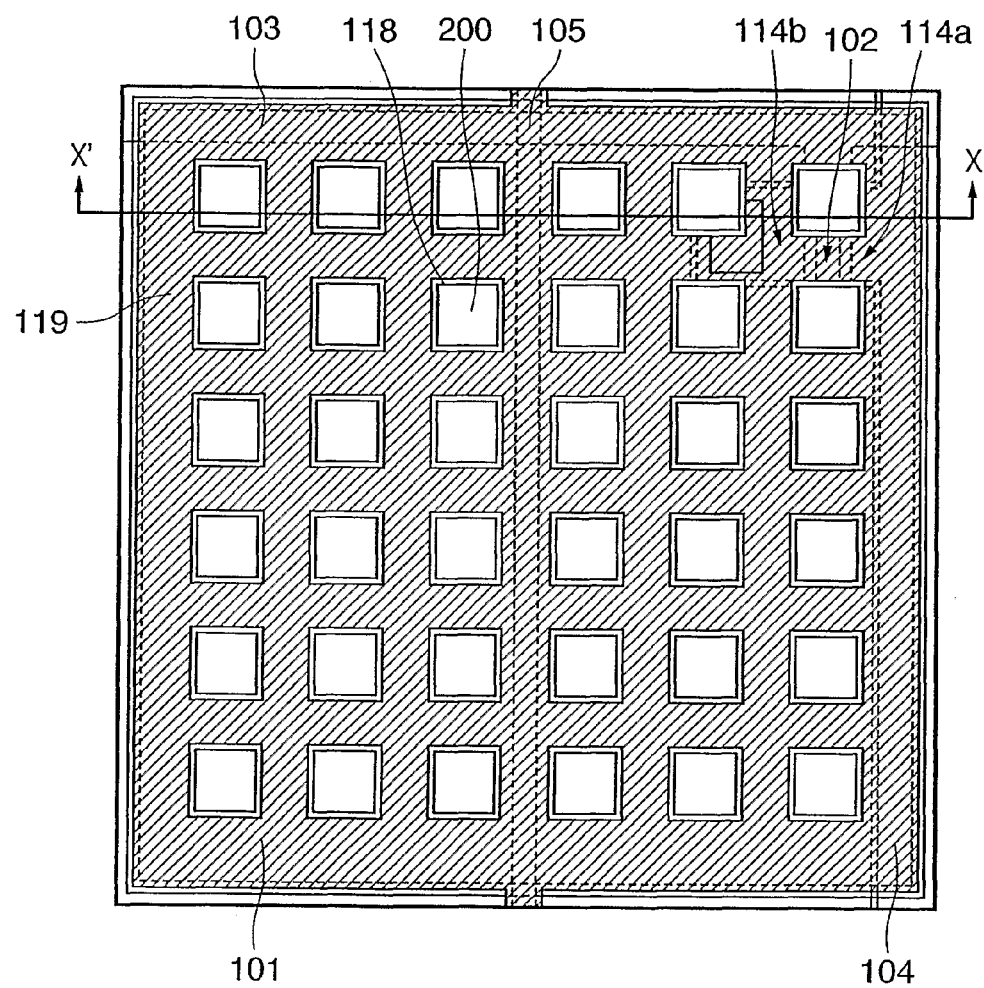
FIG. 11 is a schematic plan view of a pixel according to the preferred fifth embodiment of the present invention.

FIG. 11 is a schematic plan view of one pixel according to the preferred fifth embodiment of the present invention. The same reference numerals as in the first embodiment denote the similar elements in the fifth embodiment.

Figure 12:
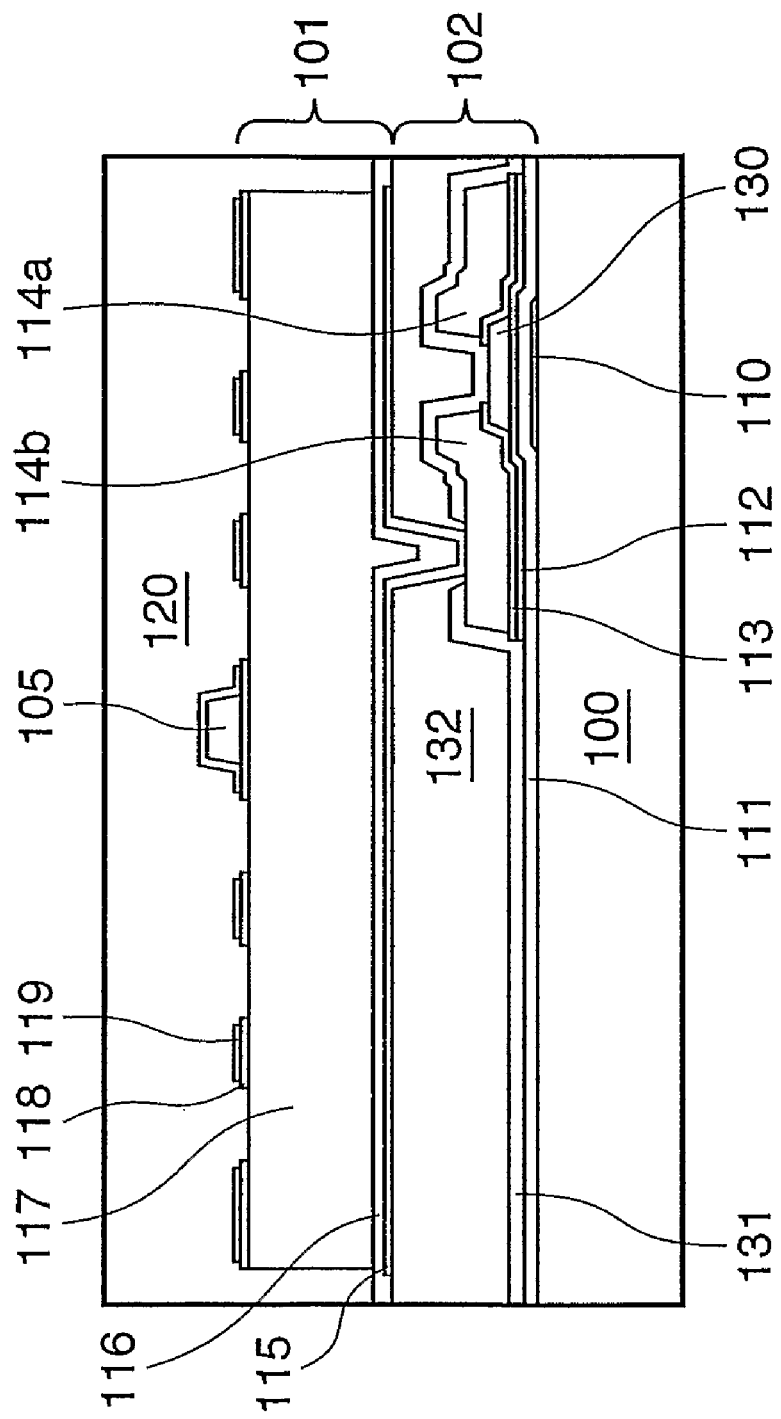
FIG. 12 is a schematic cross-sectional view along line X-X' of FIG. 11.

FIG. 12 is a schematic cross-sectional view along line X-X' of FIG. 11. Reference numeral 100 denotes an insulating substrate; 110, a gate electrode of a switching element 102; 111, a first insulating layer serving as the gate insulating film of the switching element 102; 112, a first semiconductor layer serving as the active layer of the switching element 102; 113, a first impurity semiconductor layer serving as the ohmic contact layer of the switching element 102; 114, a layer serving as a source electrode 114a or a drain electrode 114b of the switching element 102; 130, a channel protective layer of the switching element 102; 131, a first interlayer dielectric film; and 132, a second interlayer dielectric film.

Reference numeral 115 denotes a lower electrode layer of a conversion element 101; 116, a second insulating layer serving as the insulating layer of the conversion element 101; 117, a second semiconductor layer serving as the photoelectric conversion layer of the conversion element 101; 118, a second impurity semiconductor layer of the conversion element 101; and 119, an upper electrode layer (transparent electrode layer) of the conversion element 101. The conversion element 101 includes the layers 116 to 119. Reference numeral 120 denotes a protective layer. A wavelength converter (not shown) is stacked on the protective layer 120. The upper electrode layer 119 includes the electrodes having openings 200 in a region where at least the second semiconductor layer 117 is arranged.

In this embodiment, the conversion element 101 is stacked on the array of the switching element 102 while sandwiching an interlayer dielectric film between them. The lower electrode layer 115 of the conversion element 101 is connected to the source electrode 114a or drain electrode 114b of the switching element 102 via a contact hole. The upper electrode layer 119 of the conversion element 101 has the openings 200, each having a size of about 10-µm square.

Sixth Embodiment

Figure 13:
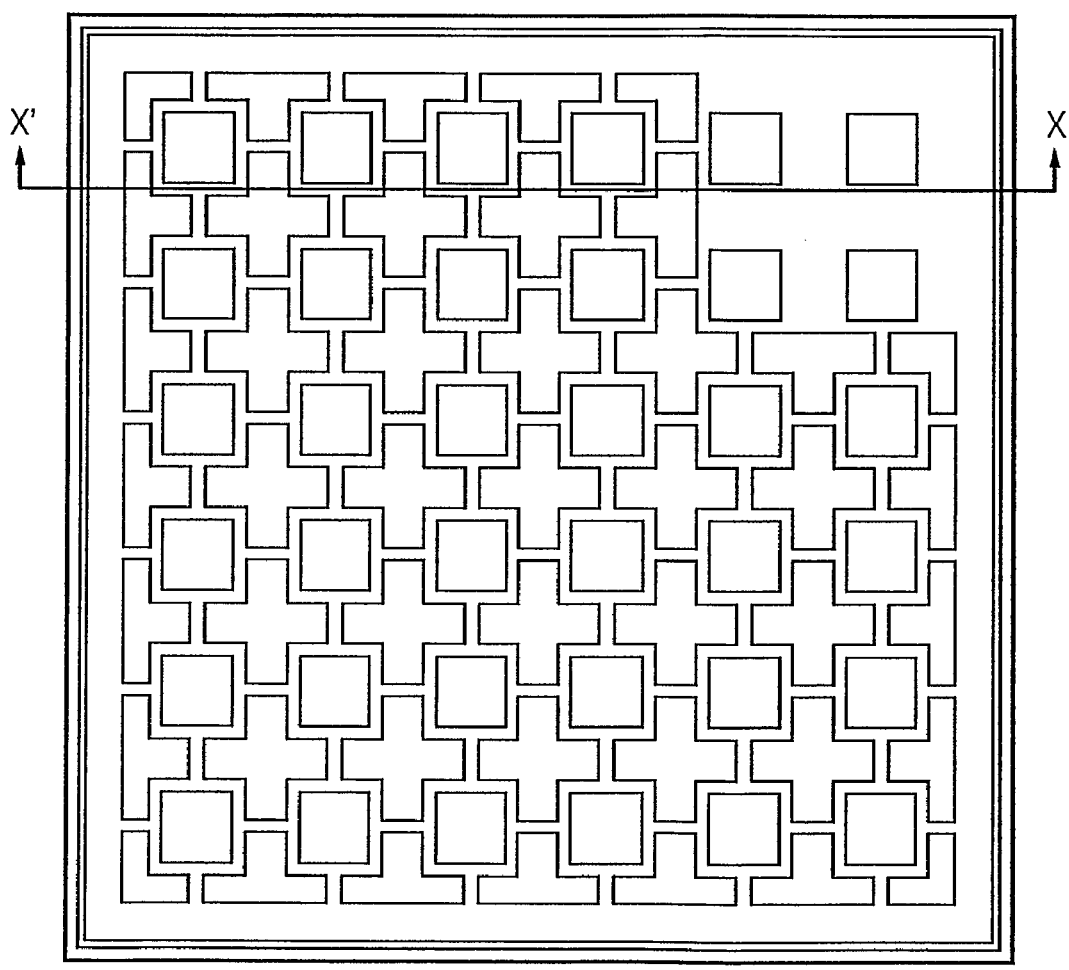
FIG. 13 is a schematic plan view of a pixel sensor unit having a stacked structure similar to the preferred sixth embodiment of the present invention.

FIG. 13 is a schematic plan view of one pixel sensor portion in the same stacked structure as in the preferred fifth embodiment of the present invention. FIG. 14 is a schematic plan view of the lower electrode layer of a conversion element 101. FIG. 15 is a schematic plan view of the upper electrode layer of the conversion element 101. Referring to FIGS. 14 and 15, the hatched portions indicate regions where electrodes exist. FIG. 13 shows a state wherein the electrodes overlap. As is apparent from FIG. 13, the upper electrode layer and lower electrode layer of the conversion element 101 overlap except opening through both electrodes. If opening exists, the electric field cannot sufficiently spread, and carriers generated by photoelectric conversion cannot smoothly drift.

Figure 16:
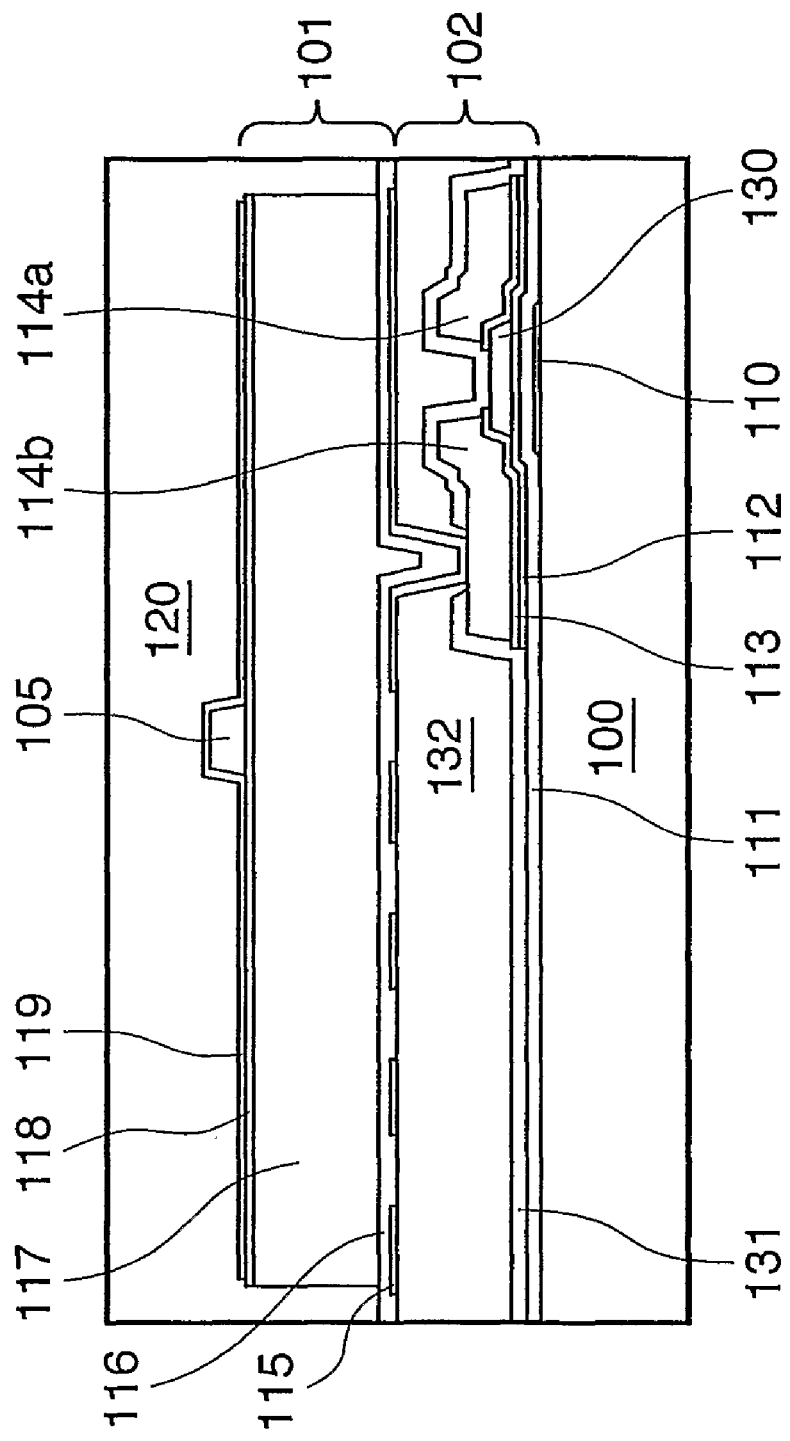
FIG. 16 is a schematic cross-sectional view along line X-X' of FIG. 13.

FIG. 16 is a schematic cross-sectional view along line X-X' of FIG. 13. Reference numeral 100 denotes an insulating substrate; 110, a gate electrode of a switching element 102; 111, a first insulating layer serving as the gate insulating film of the switching element 102; 112, a first semiconductor layer serving as the active layer of the switching element 102; 113, a first impurity semiconductor layer serving as the ohmic contact layer of the switching element 102; 114, a layer serving as a source electrode 114*a* or a drain electrode 114*b* of the switching element 102; 130, a channel protective layer of the switching element 102; 131, a first interlayer dielectric film; and 132, a second interlayer dielectric film.

Reference numeral 115 denotes a lower electrode layer of a conversion element 101; 116, a second insulating layer serving as the insulating layer of the conversion element 101; 117, a second semiconductor layer serving as the photoelectric conversion layer of the conversion element 101; 118, a second impurity semiconductor layer of the conversion element 101; and 119, an upper electrode layer (transparent electrode layer) of the conversion element 101. The conversion element 101 includes the layers 116 to 119. Reference numeral 120 denotes a protective layer. A wavelength converter (not shown) is stacked on the protective layer 120.

Seventh Embodiment

Figure 17:
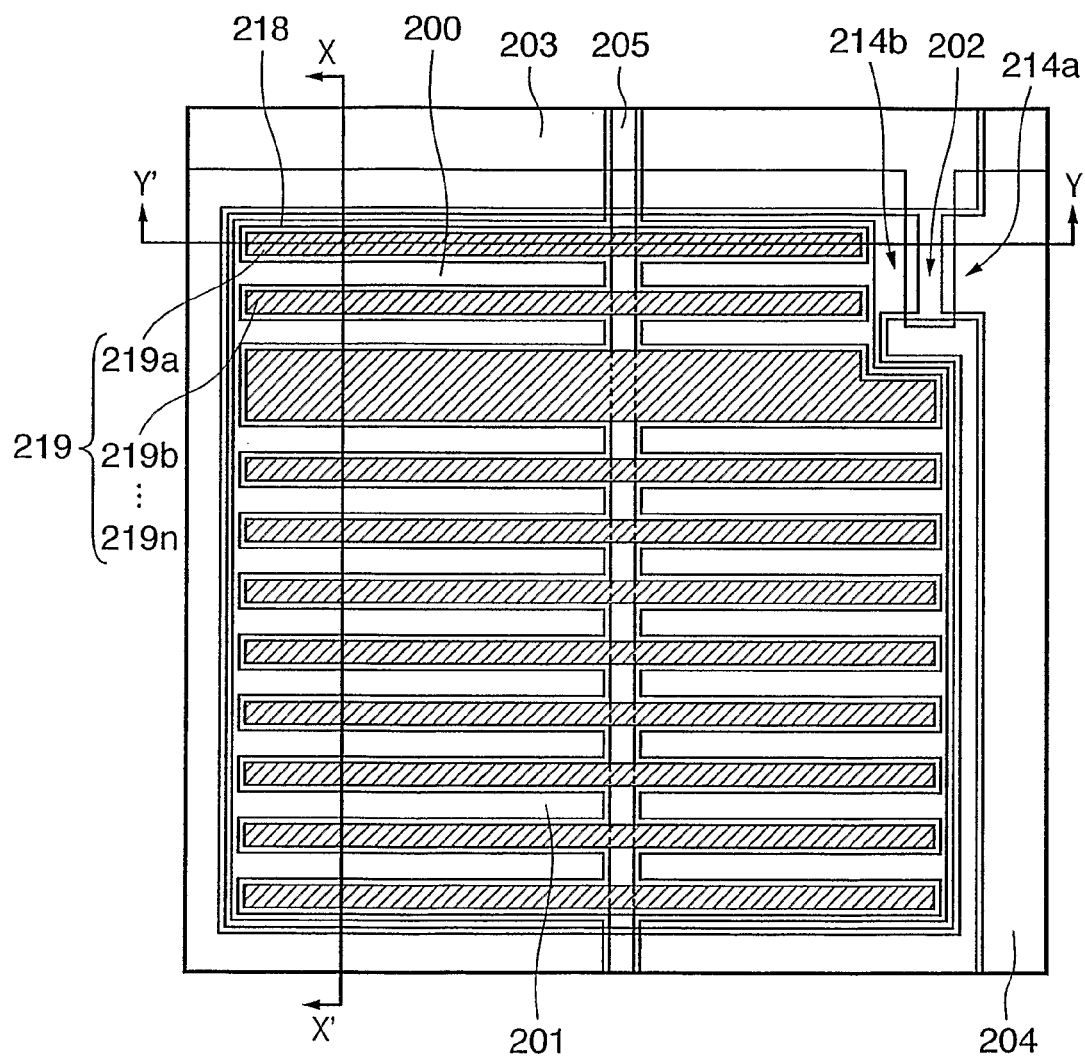
FIG. 17 is a schematic plan view of a pixel according to the preferred seventh embodiment of the present invention.

FIG. 17 is a schematic plan view of one pixel according to the preferred seventh embodiment of the present invention. The pixel of this embodiment is also applicable to a radiation imaging apparatus with the arrangement shown in FIG. 1.

Figure 18:
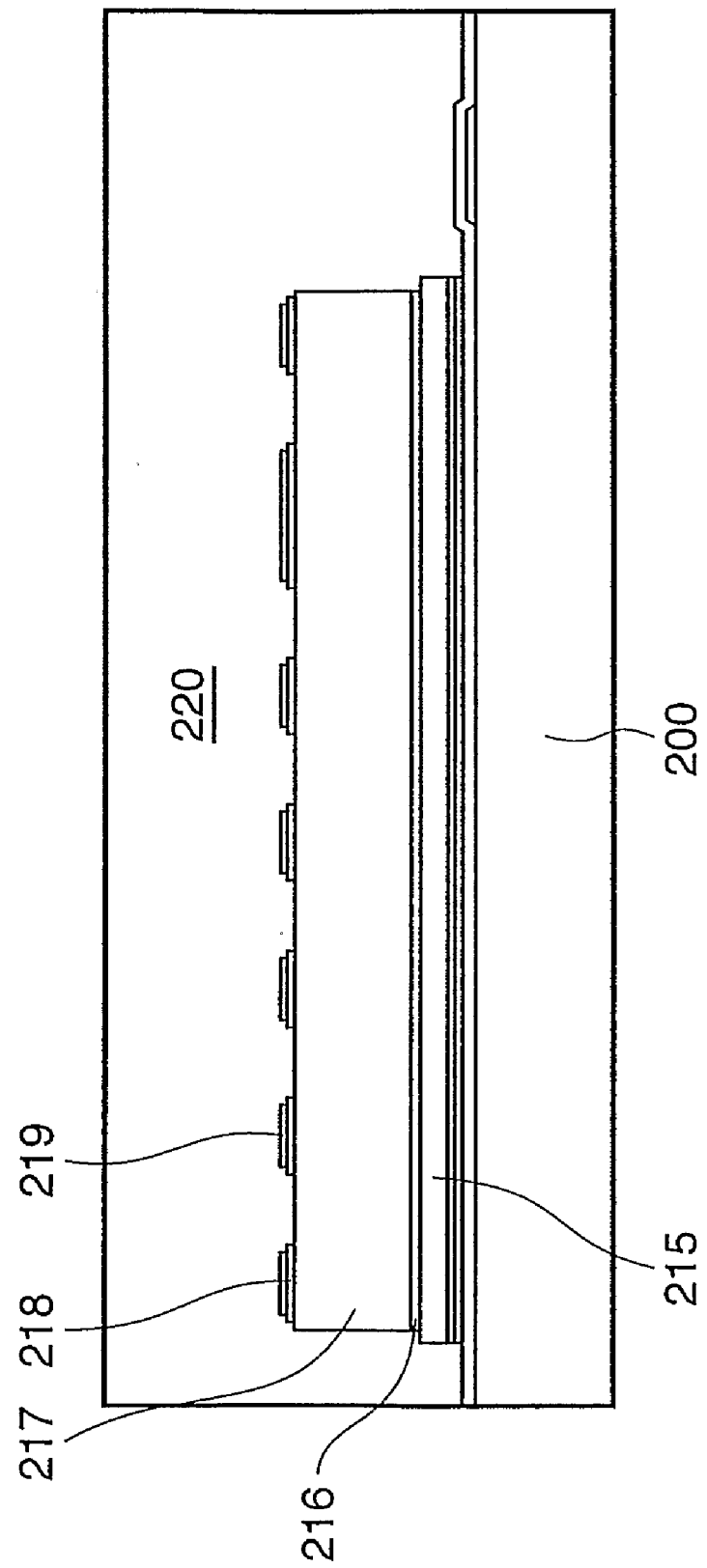
FIG. 18 is a schematic cross-sectional view along line X-X' of FIG. 17.

FIG. 18 is a schematic cross-sectional view along line X-X' of FIG. 17. Reference numeral 215 denotes a lower electrode layer of a conversion element 201; 216, a first impurity semiconductor layer of the conversion element 201; 217, a second semiconductor layer serving as the photoelectric conversion layer of the conversion element 201; 218, a second impurity semiconductor layer of the conversion element 201; and 219, an upper electrode layer (transparent electrode layer) of the conversion element 201. The conversion element 201 is a PIN photoelectric conversion element including the layers 216 to 219. Reference numeral 220 denotes a protective layer. A wavelength converter (not shown) is stacked on the protective layer 220.

Figure 19:
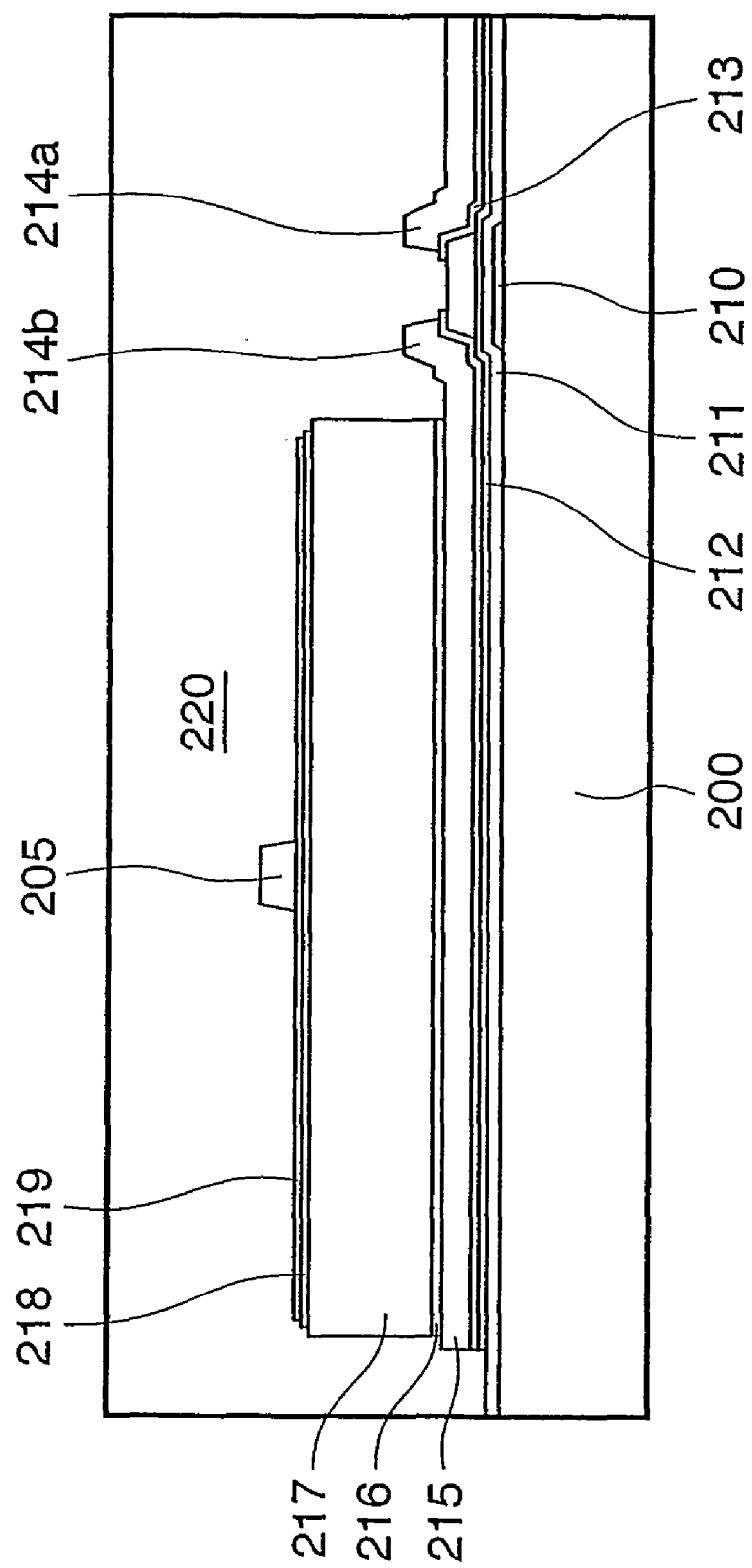
FIG. 19 is a schematic cross-sectional view along line Y-Y' of FIG. 17.

FIG. 19 is a schematic cross-sectional view along line Y-Y' of FIG. 17. Reference numeral 210 denotes a gate electrode of a switching element 202; 211, a first insulating layer serving as the gate insulating film of the switching element 202; 212, a first semiconductor layer serving as the active layer of the switching element 202; 213, a first impurity semiconductor layer serving as the ohmic contact layer of the switching element 202; 214*a*, a source electrode of the switching element 202; and 214*b*, a drain electrode of the switching element 202. The lower electrode layer 215 of the conversion element 201 also serves as the source electrode 214*a* or drain electrode 214*b* of the switching element 202. The layer 216 is the first impurity semiconductor layer of the conversion element 201. The second semiconductor layer 217 serves as the photoelectric conversion layer of the conversion element 201. The layer 218 is the second impurity semiconductor layer of the conversion element 201. The layer 219 is the upper electrode layer (transparent electrode layer) of the conversion element 201. The conversion element 201 includes the layers 216 to 219. A bias line 205 is connected to the upper electrode layer 219 to form the upper electrode layer of the conversion element 201. A wavelength converter (not shown) is stacked on the protective layer 220.

In this embodiment, the upper electrode layer 219 has openings 200 in a region where at least the second semiconductor layer 217 is arranged and includes a plurality of band-shaped electrodes 219*a*, 219*b*, ..., 219*n*, which are connected to the bias line 205. The plurality of divided band-shaped electrodes 219*a*, 219*b*, ..., 219*n* are distributed in the region and are electrically connected to the bias line 205. No second impurity semiconductor layer 218 exists in the opening 200. The width of the opening 200 is preferably 10 μm from the viewpoint of spread of the electric field. The overlap area of the upper and lower electrodes of the conversion element 201 generally determines its capacitance. The conversion element 101 of this embodiment has a lower capacitance than before so that noise related to the capacitance of the conversion element 201 can be reduced.

The opening ratio of the conversion element 201 generally determine its sensitivity. Since the element has the openings 200, that is, regions which are formed by removing the second impurity semiconductor layer 218 of the sensor element and eliminate unwanted light absorption, the output is improved. Since the capacitance of the conversion element 201 decreases, the size of the switching element 202 becomes small. As a result, the opening ratio of the conversion element 201 can further increase. When a short circuit is created between the upper and lower electrodes of the conversion element 201, the corresponding part of the upper electrode layer of the conversion element 201 is cut out, as shown in FIG. 5. This allows to repair the short circuit between the upper and lower electrodes.

Eighth Embodiment

Figure 20:
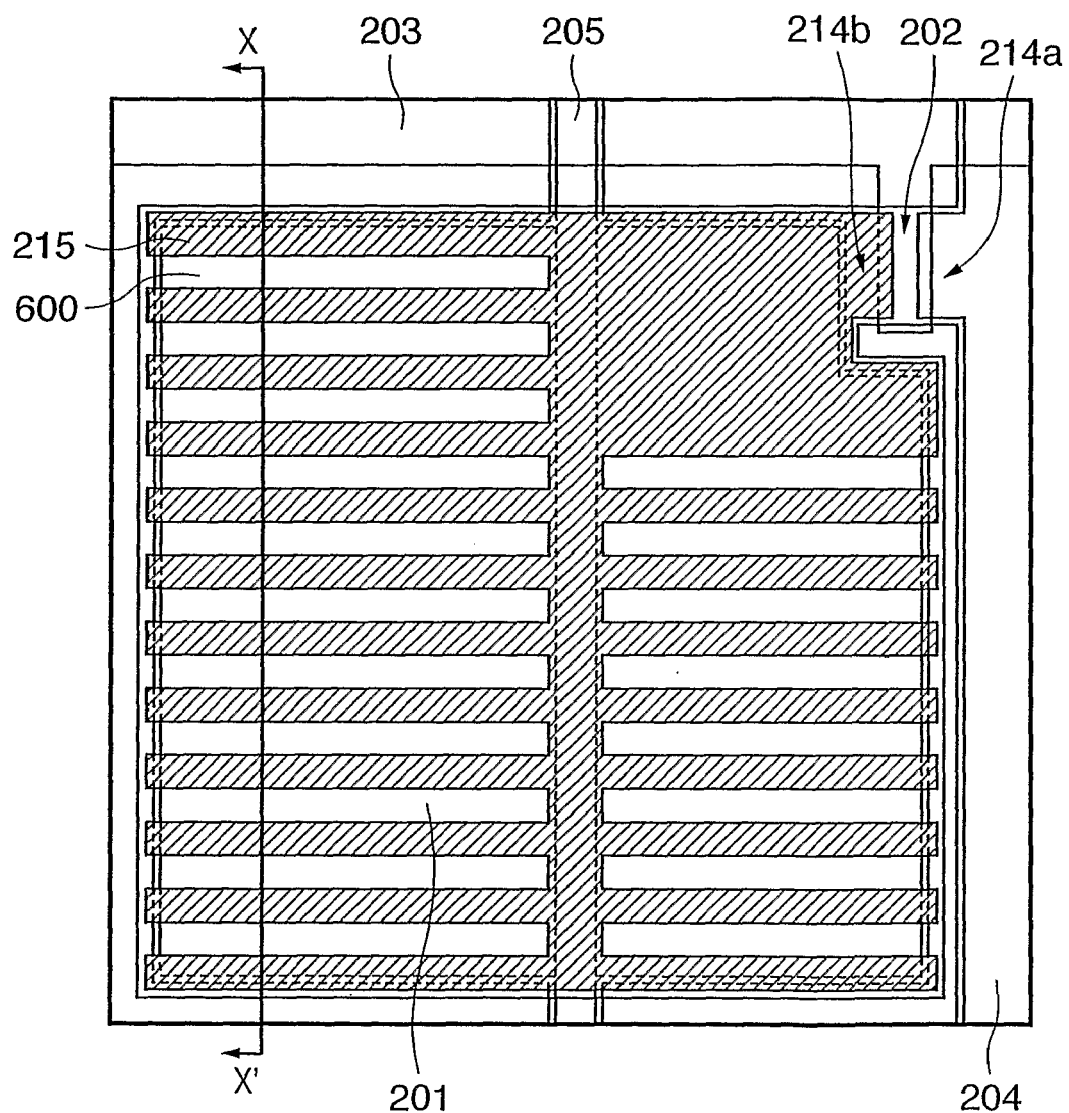
FIG. 20 is a schematic plan view of a pixel according to the preferred eighth embodiment of the present invention.

FIG. 20 is a schematic plan view of one pixel according to the preferred eighth embodiment of the present invention. The same reference numerals as in the seventh embodiment denote the similar elements in the eighth embodiment.

Figure 21:
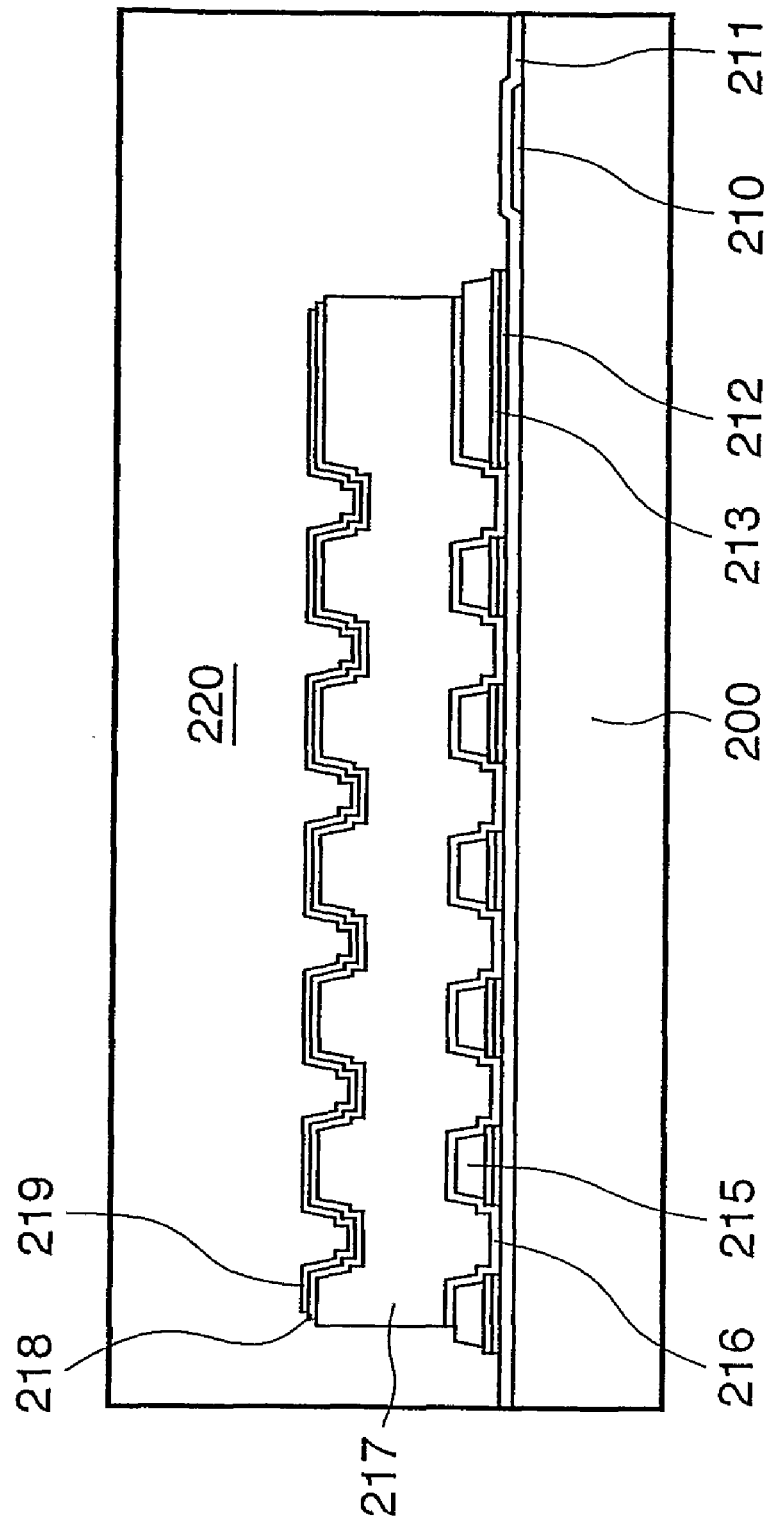
FIG. 21 is a schematic cross-sectional view along line X-X' of FIG. 20.

FIG. 21 is a schematic cross-sectional view along line X-X' of FIG. 20. Reference numeral 215 denotes a lower electrode layer of a conversion element 201; 216, a first impurity semiconductor layer of the conversion element 201; 217, a second semiconductor layer serving as the photoelectric conversion layer of the conversion element 201; 218, a second impurity semiconductor layer of the conversion element 201; and 219, an upper electrode layer (transparent electrode layer) of the conversion element 201. The conversion element 201 includes the layers 216 to 219. Reference numeral 220 denotes a protective layer. A wavelength converter (not shown) is stacked on the protective layer 220.

In this embodiment, the lower electrode layer 215 of the conversion element 201 has a comb-like electrode structure having slits 600 in a region where at least the second semiconductor layer 217 is arranged. The electrode elements have an interval of about 10 μm. The overlap area of the upper and lower electrodes of the conversion element 201 generally determines its capacitance. The conversion element 201 has a lower capacitance than before so that noise related to the capacitance of the conversion element 201 can be reduced. Additionally, since the conversion element 201 has a lower capacitance, the size of a switching element 202 can be reduced. As a result, the opening ratio of the conversion element 201 can further increase.

In this embodiment as well, when the conversion element is formed by using a-Si, light is incident on the lower surface of the sensor substrate, as shown in FIG. 8. This structure enables to efficiently input light to the conversion element.

Ninth Embodiment

Figures 22A, 22B:
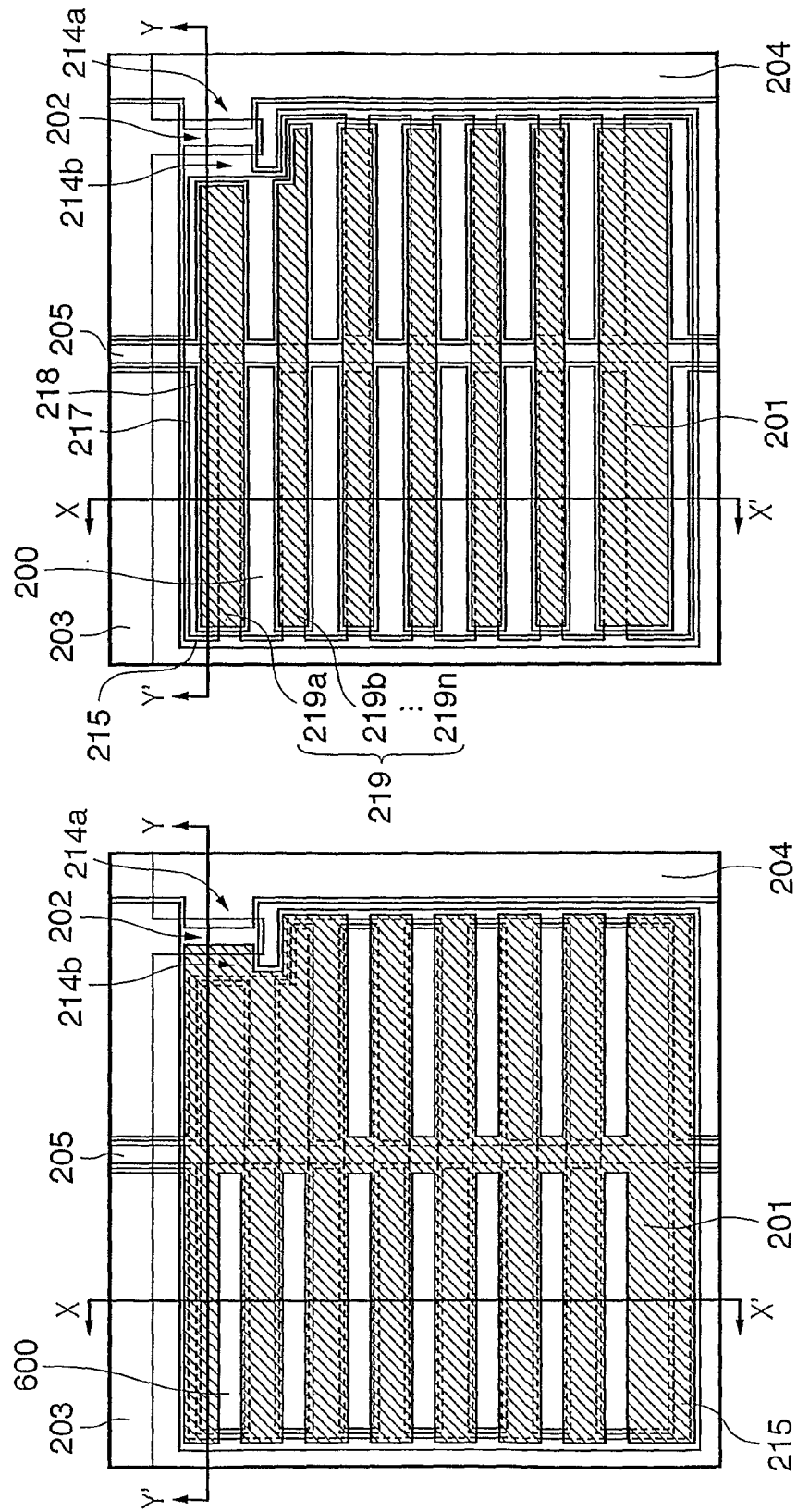
FIG. 22A is a schematic plan view of a pixel according to the preferred ninth embodiment of the present invention.
FIG. 22B is a schematic plan view of a pixel according to the preferred ninth embodiment of the present invention.

FIGS. 22A and 22B are schematic plan views of one pixel according to the preferred ninth embodiment of the present invention. FIG. 22A shows the lower electrode layer side, and FIG. 22B shows the upper electrode layer side. The same reference numerals as in the seventh embodiment denote the similar elements in the ninth embodiment.

Figure 23:
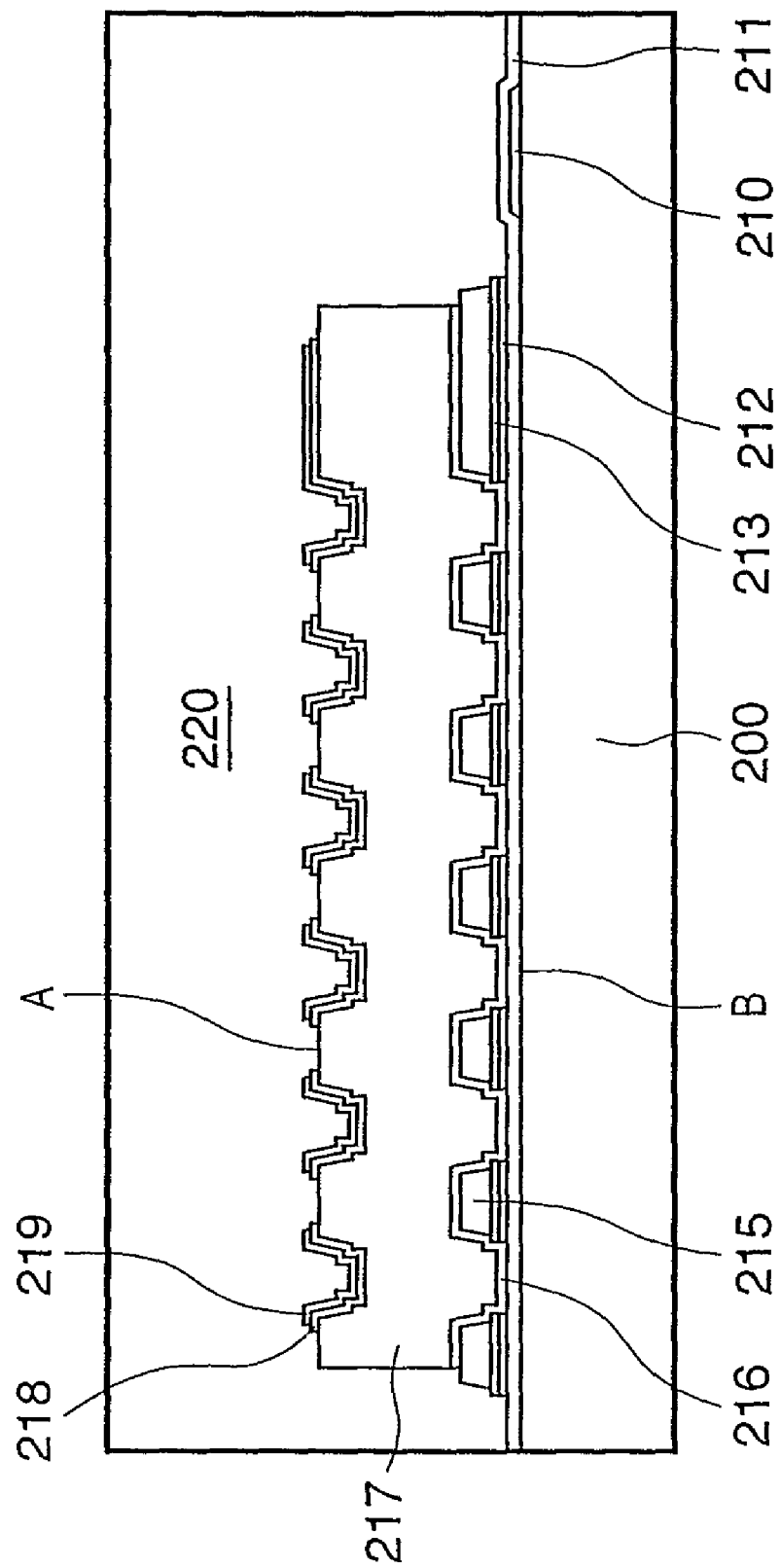
FIG. 23 is a schematic cross-sectional view along line X-X' of FIGS. 22A and 22B.

FIG. 23 is a schematic cross-sectional view along line X-X' of FIGS. 22A and 22B. Reference numeral 215 denotes a lower electrode layer of a conversion element 201; 216, a first impurity semiconductor layer of the conversion element 201; 217, a second semiconductor layer serving as the photoelectric conversion layer of the conversion element 201; 218, a second impurity semiconductor layer of the conversion element 201; and 219, an upper electrode layer (transparent electrode layer) of the conversion element 201. The conversion element 201 includes the layers 216 to 219. Reference numeral 220 denotes a protective layer. A wavelength converter (not shown) is stacked on the protective layer 220.

The lower electrode layer of the conversion element 201 is arranged under a region A (opening 200) without the upper electrode layer of the conversion element 201. Conversely, the upper electrode layer of the conversion element 201 is arranged above a region B (slit 600) except a region of the lower electrode layer of the conversion element 201. The upper electrode layer and lower electrode layer of the conversion element 201 overlap except opening through both electrodes. If opening exists, the electric field cannot sufficiently spread, and carriers generated by photoelectric conversion cannot smoothly drift. The interval between the individual sensor electrodes is about 10 μm, as in the above-described embodiments. The schematic cross-sectional view along line Y-Y' of FIGS. 22A and 22B indicates the overlap portion of the upper and lower electrodes of the above-described conversion element 201, like FIG. 18 of the seventh embodiment.

10th Embodiment

Figure 24:
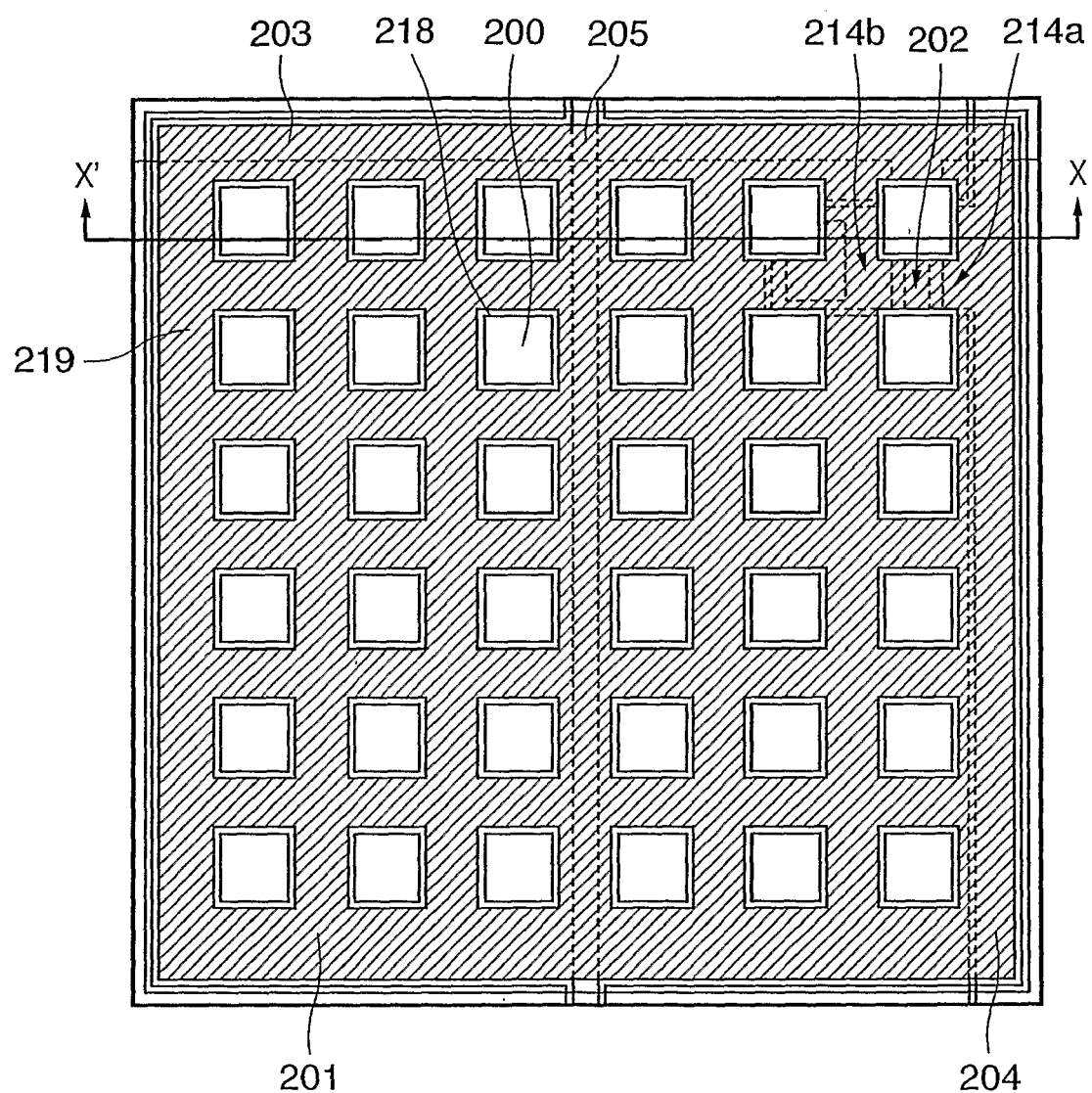
FIG. 24 is a schematic plan view of a pixel according to the preferred tenth embodiment of the present invention.

FIG. 24 is a schematic plan view of one pixel according to the preferred 10th embodiment of the present invention. The same reference numerals as in the seventh embodiment denote the similar elements in the 10th embodiment.

Figure 25:
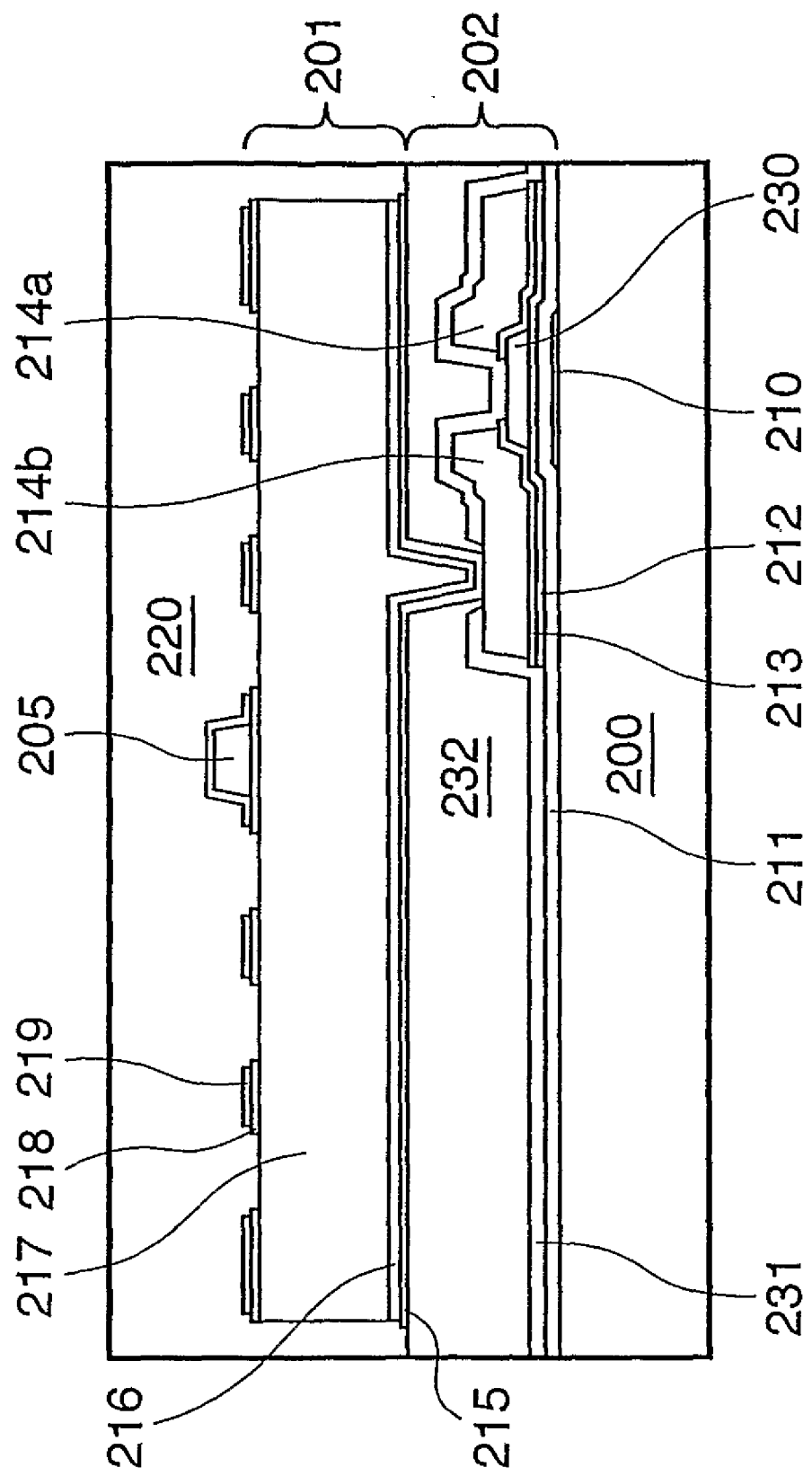
FIG. 25 is a schematic cross-sectional view along line X-X' of FIG. 24.

FIG. 25 is a schematic cross-sectional view along line X-X' of FIG. 24. Reference numeral 200 denotes an insulating substrate; 210, a gate electrode of a switching element 202; 211, a first insulating layer serving as the gate insulating film of the switching element 202; 212, a first semiconductor layer serving as the active layer of the switching element 202; 213, a first impurity semiconductor layer serving as the ohmic contact layer of the switching element 202; 214, a layer serving as a source electrode 214a or a drain electrode 214b of the switching element 202; 230, a channel protective layer of the switching element 202; 231, a first interlayer dielectric film; and 232, a second interlayer dielectric film.

Reference numeral 215 denotes a lower electrode layer of a conversion element 201; 216, a first impurity semiconductor layer 216 of the conversion element 201; 217, a second semiconductor layer serving as the photoelectric conversion layer of the conversion element 201; 218, a second impurity semiconductor layer of the conversion element 201; and 219, an upper electrode layer (transparent electrode layer) of the conversion element 201. The conversion element 201 is a PIN photoelectric conversion element including the layers 216 to 219. Reference numeral 220 denotes a protective layer. A wavelength converter (not shown) is stacked on the protective layer 220. The upper electrode layer 219 includes the electrodes having openings 200 in a region where at least the second semiconductor layer 217 is arranged.

In this embodiment, the conversion element 201 is stacked on the array of the switching elements 202 while sandwiching a flat interlayer dielectric film between them. The lower electrode layer 215 is connected to the source electrode 214a or drain electrode 214b of the switching element 202 via a contact hole. The upper electrode layer 219 has the openings 200, each having a size of about 10-μm square.

11th Embodiment

The schematic plan view of one pixel in the same stacked structure as in the 10th embodiment is the same as FIG. 13. The lower electrode layer of a conversion element 201 is the same as in FIG. 14. The upper electrode layer of the conversion element 201 is the same as in FIG. 15.

In this embodiment as well, the upper electrode layer and lower electrode layer of the conversion element 201 formed from a PIN photoelectric conversion element overlap without forming any gaps. If a gap exists, the electric field cannot sufficiently spread, and carriers generated by photoelectric conversion cannot smoothly drift.

Figure 26:
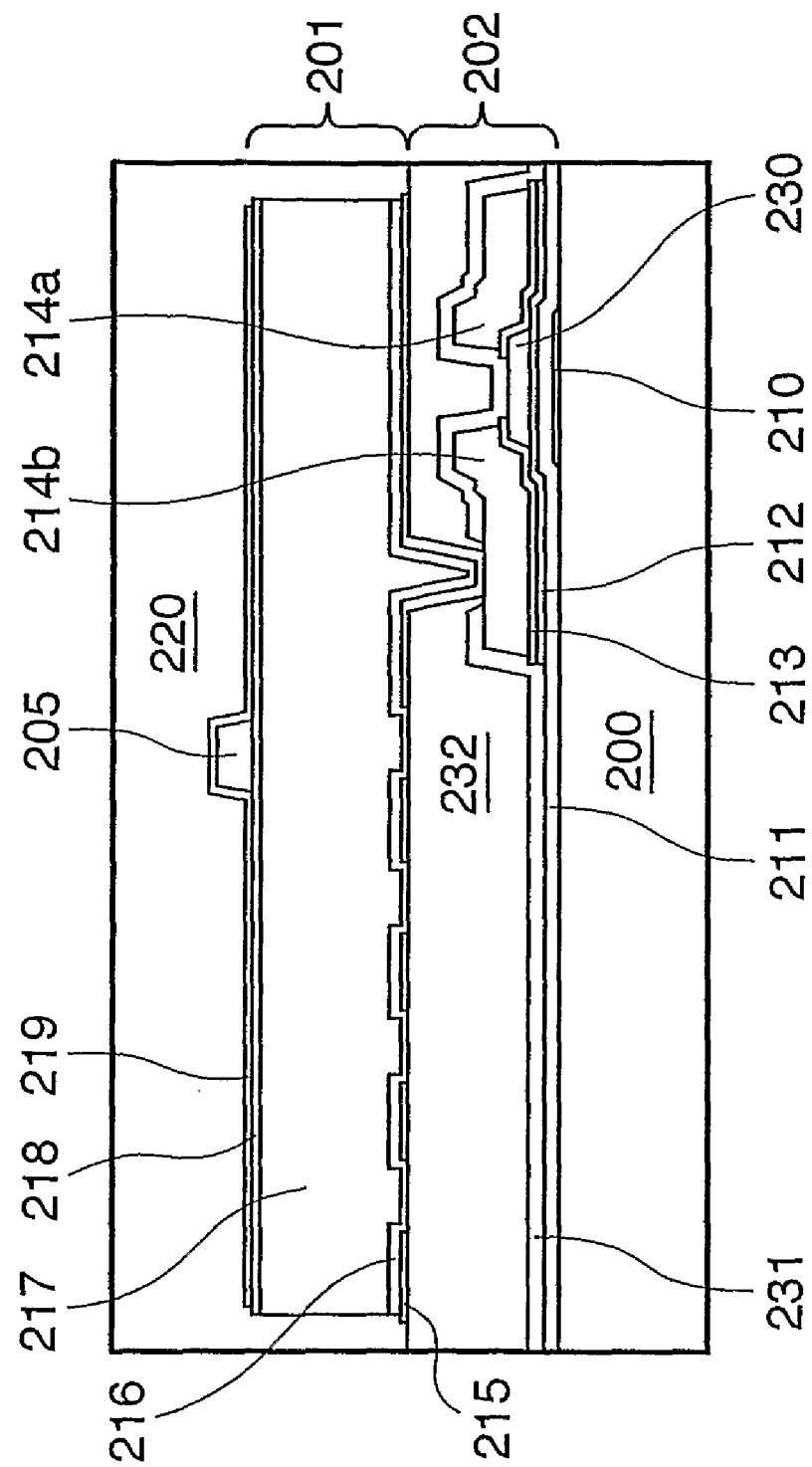
FIG. 26 is a schematic cross-sectional view along line X-X' of FIG. 13 for the pixel according to the preferred eleventh embodiment of the present invention.

FIG. 26 is a sectional view of one pixel according to the 11th embodiment at almost the same position as in the schematic cross-sectional view along line X-X' of FIG. 13. Reference numeral 200 denotes an insulating substrate; 210, a gate electrode of a switching element 202; 211, a first insulating layer serving as the gate insulating film of the switching element 202; 212, a first semiconductor layer serving as the active layer of the switching element 202; 213, a first impurity semiconductor layer serving as the ohmic contact layer of the switching element 202; 214, a layer serving as a source electrode 214a or a drain electrode 214b of the switching element 202; 230, a channel protective layer of the switching element 202; 231, a first interlayer dielectric film; and 232, a second interlayer dielectric film.

Reference numeral 215 denotes a lower electrode layer of the conversion element 201; 216, first impurity semiconductor layer of the conversion element 201; 217, a second semiconductor layer serving as the photoelectric conversion layer of the conversion element 201; 218, a second impurity semiconductor layer of the conversion element 201; and 219, an upper electrode layer (transparent electrode layer) of the conversion element 201. The conversion element 201 includes the layers 216 to 219. Reference numeral 220 denotes a protective layer. A wavelength converter (not shown) is stacked on the protective layer 220.

Application Example

Figure 27:
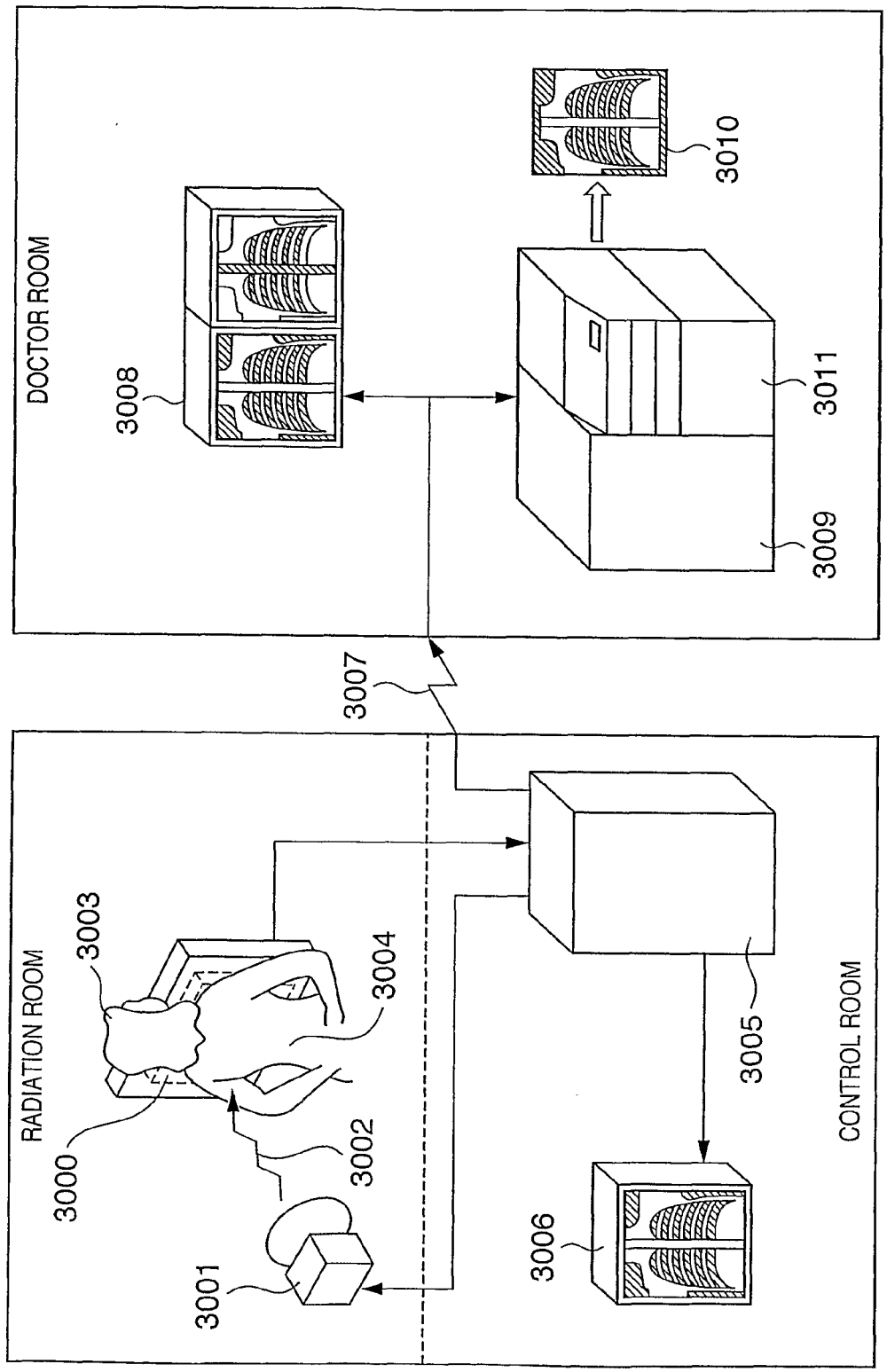
FIG. 27 is a schematic view showing an application example of the radiation imaging apparatus according to the preferred embodiments of the present invention to a radiation imaging system.

FIG. 27 is a view showing an application example in which the radiation imaging apparatus according to the preferred embodiment of the present invention is applied to a radiation imaging system.

Radiation 3002 generated by a radiation generator 3001 such as a radiation tube passes through a body observation part 3004 such as the chest of a subject 3003 (e.g., patient) and is incident on an radiation imaging apparatus 3000 with a scintillator (phosphor) attached to the upper part. The incident radiation 3002 contains information in the body of the subject 3003. In the radiation imaging apparatus 3000, the scintillator emits light in correspondence with the incident radiation 3002. Electrical information is obtained by photoelectrically converting the light. The radiation imaging apparatus 3000 may directly convert the radiation 3002 into electric charges to obtain electrical information. This information is converted into digital data, subjected to an image process by an image processor 3005 serving as a signal processing means, and displayed on a display 3006 serving as a display means in the control room.

A transmission means 3007 such as a radio channel or a telephone line can transmit the information to a remote site. A display 3008 serving as a display means installed in, for example, a doctor room of another place can display the data, or a film processor 3009 serving as a storage means saves it on a recording medium such as an optical disk. This allows a doctor in a remote site to make a diagnosis. The film processor 3009 is connected to a laser printer 3011 serving as a print means so that the information transmitted by the transmission means 3007 can be printed on a printing medium 3010 such as a film.

As described above, according to the preferred embodiment of the present invention, the capacitance can greatly be reduced without decreasing the opening ratio of the conversion element. It is therefore possible to reduce, for example, kTC noise caused by the capacitance. Since the sensor capacitance decreases, the transfer speed can improve. Consequently, the switching element can be made small, and the sensor opening ratio can be increased. Since the overlap capacitance between the gate and source of the switching element decreases, the signal line parasitic capacitance decreases, and noise can further be reduced.

In addition, various effects are achieved so that, for example, the amount of incident light can be increased by increasing light directly incident on the semiconductor layer, and light striking the lower surface is facilitated upon, for example, optical reset in moving image driving.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-161643, filed Jun. 9, 2006, which is hereby incorporated by reference herein in its entirety.

The invention claimed is:

1. An imaging apparatus comprising:
    a pixel region, on a substrate, including a plurality of pixels arranged in a matrix, each pixel having a photoelectric conversion element that converts light into electric charges and a switching element,
    wherein the photoelectric conversion element has
        a first electrode layer to which a bias line is electrically connected,
        a second electrode layer,
        a semiconductor layer arranged between the first electrode layer and the second electrode layer, and
        an impurity semiconductor layer arranged between the first or second electrode layer and the semiconductor layer, and
    wherein the switching element has a gate electrode, a drain electrode, and a source electrode, and transfers, to a signal line, a signal corresponding to the electric charges converted by the photoelectric conversion element, and
    an electrode which is arranged on a light-incident side of the impurity semiconductor layer and which is either the first electrode layer or the second electrode layer has an opening at least within a region where the semiconductor layer is arranged, and
    the impurity semiconductor layer has an opening within a region where the opening of the electrode which is arranged on the light-incident side of the impurity semiconductor layer and which is either the first electrode layer or the second electrode layer is arranged.

2. An imaging apparatus according to claim 1, wherein the first electrode layer includes an electrode group having a plurality of electrodes.

3. An imaging apparatus according to claim 2, wherein at least one of the electrodes is partially disconnected.

4. An imaging apparatus according to claim 1, wherein the second electrode layer includes a slit at least within a region where the semiconductor layer is arranged.

5. An imaging apparatus according to claim 4, wherein the first electrode layer is arranged above the slit.

6. An imaging apparatus according to claim 1, wherein the photoelectric conversion element is arranged above the switching element via an interlayer dielectric film.

7. An imaging apparatus according to claim 1, wherein the photoelectric conversion element is an MIS photoelectric conversion element.

8. An imaging apparatus according to claim 1, wherein the photoelectric conversion element is a PIN photoelectric conversion element.

9. An imaging system comprising:
    an imaging apparatus as in claim 1, and
    a signal-processing unit configured to process a signal from the imaging apparatus.

10. An imaging apparatus according to claim 1, wherein the first or second electrode layer is a transparent electrode layer.

11. An imaging apparatus according to claim 1, wherein the width of the opening of the first or second electrode layer is equal to or less than 10 m.

12. A radiation imaging apparatus comprising:
    an imaging apparatus according to claim 1; and
    wavelength converters each of which converts radiation into light and directs the converted light to a photoelectric conversion element in the imaging apparatus.

* * * * *